(12) United States Patent
Hwang et al.

(10) Patent No.: US 8,772,806 B2
(45) Date of Patent: Jul. 8, 2014

(54) LIGHT EMITTING DEVICE

(75) Inventors: Sung Min Hwang, Seoul (KR); Kyoung Woo Jo, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 246 days.

(21) Appl. No.: 13/039,464

(22) Filed: Mar. 3, 2011

(65) Prior Publication Data

US 2011/0215358 A1    Sep. 8, 2011

(30) Foreign Application Priority Data

Mar. 8, 2010    (KR) .................. 10-2010-0020416
Mar. 10, 2010   (KR) .................. 10-2010-0021089

(51) Int. Cl.
*H01L 33/00* (2010.01)

(52) U.S. Cl.
USPC .............................................. 257/98; 257/99

(58) Field of Classification Search
USPC ........ 257/81, 88–91, 95, 96, 98, 99, E33.062, 257/E33.065, E33.072
See application file for complete search history.

(56) References Cited

U.S. PATENT DOCUMENTS

| 7,095,061 B2 | 8/2006 | Steigerwald et al. | 257/99 |
| 7,173,288 B2 | 2/2007 | Lee et al. | 257/94 |
| 7,442,965 B2 * | 10/2008 | Wierer et al. | 257/98 |
| 2003/0222269 A1 | 12/2003 | Lin et al. | 257/99 |
| 2004/0217360 A1 | 11/2004 | Negley | 257/79 |
| 2005/0067624 A1 | 3/2005 | Steigerwald et al. | 257/79 |
| 2005/0224833 A1 | 10/2005 | Fudeta | 257/103 |
| 2008/0173880 A1 | 7/2008 | Manabe et al. | 257/86 |
| 2010/0171135 A1 * | 7/2010 | Engl et al. | 257/98 |
| 2010/0283070 A1 | 11/2010 | Kim et al. | 257/98 |

FOREIGN PATENT DOCUMENTS

| CN | 1681137 A | 10/2005 |
| DE | 10 2007 022 947 A1 | 10/2008 |
| DE | 102007022947 | * 10/2008 |
| DE | 10 2008 051 048 A1 | 4/2010 |
| EP | 1 577 958 A1 | 9/2005 |
| JP | 06-314825 A | 11/1994 |
| JP | 2000-150958 A | 5/2000 |
| JP | 2002-289916 A | 10/2002 |
| JP | 3407334 B2 | 3/2003 |
| JP | 2004-047988 A | 2/2004 |
| JP | 2005-317959 A | 11/2005 |
| KR | 10-2006-0025821 A | 3/2006 |
| TW | 200903863 | 1/2009 |
| WO | WO 2005/081319 A1 | 9/2005 |

(Continued)

OTHER PUBLICATIONS

European Search Report dated Jul. 5, 2011 issued in Application No. 11 15 6271.

*Primary Examiner* — Hung Vu
(74) *Attorney, Agent, or Firm* — KED & Associates, LLP

(57) ABSTRACT

A light emitting device of the embodiment includes a light emitting structure including a first semiconductor layer, an active layer and a second semiconductor layer; a first cavity passing through the first semiconductor layer and the active layer to expose the second semiconductor layer; a first electrode extending to the outside of the first cavity from the second semiconductor layer in the first cavity; a second electrode disposed on an outer peripheral region of a bottom surface of the first semiconductor layer and spaced apart from the first electrode while surrounding a lateral side of the first electrode; and a first insulating layer between the first electrode and the light emitting structure.

20 Claims, 25 Drawing Sheets

(56) References Cited

FOREIGN PATENT DOCUMENTS

| WO | WO 2008/047325 A2 | 4/2008 |
| WO | WO 2008/078301 A2 | 7/2008 |
| WO | WO 2008/131735 A1 | 11/2008 |
| WO | WO 2010/040337 A1 | 4/2010 |

* cited by examiner

LIGHT EMITTING DEVICE

The present application claims priority of Korean Patent Application No. 10-2010-0020416 filed on Mar. 8, 2010 and Korean Patent Application No. 10-2010-0021089 filed on Mar. 10, 2010, which are hereby incorporated by reference in their entirety.

BACKGROUND

The embodiment relates to a light emitting device.

A light emitting device (LED) includes a p-n junction diode having a characteristic of converting electric energy into light energy. The p-n junction diode can be formed by combining group III and group V elements of the periodic table. The LED can represent various colors by adjusting the compositional ratio of compound semiconductors.

When forward voltage is applied to the LED, electrons of an n layer are combined with holes of a p layer, so that energy corresponding to an energy gap between a conduction band and a valance band may be generated.

A nitride semiconductor used for the LED represents superior thermal stability and wide bandgap energy so that the nitride semiconductor has been spotlighted in the field of optical devices and high-power electronic devices. In particular, blue, green, and UV light emitting devices employing the nitride semiconductor have already been developed and extensively used.

SUMMARY

The embodiment provides a light emitting device having a novel structure.

The embodiment provides a light emitting device capable of improving heat dissipation characteristics.

The embodiment provides a light emitting device, which can be easily packaged.

The embodiment provides a light emitting device capable of diminishing light loss.

The embodiment provides a light emitting device capable of preventing damage caused by electrostatic discharge.

The embodiment provides a light emitting device capable of improving the light emitting efficiency.

The embodiment provides a light emitting device capable of obtaining the uniform light emitting efficiency.

The embodiment provides a light emitting device capable of improving the light extraction efficiency.

A light emitting device according to the embodiment may include a light emitting structure including a light emitting structure including a first semiconductor layer, an active layer and a second semiconductor layer; a first cavity passing through the first semiconductor layer and the active layer to expose the second semiconductor layer; a first electrode extending to the outside of the first cavity from the second semiconductor layer in the first cavity; a second electrode disposed on an outer peripheral region of a bottom surface of the first semiconductor layer and spaced apart from the first electrode while surrounding a lateral side of the first electrode; and a first insulating layer between the first electrode and the light emitting structure.

A light emitting device according to the embodiment may include a light emitting structure including a first semiconductor layer, an active layer, a second semiconductor layer, and a cavity passing through the first semiconductor layer and the active layer to expose the second semiconductor layer; a first electrode extending to the outside of the cavity from the second semiconductor layer in the cavity; a second electrode disposed on an outer peripheral region of a bottom surface of the first semiconductor layer and spaced apart from the first electrode while surrounding the lateral side of the first electrode; an insulating layer between the first electrode and the light emitting structure; and a conductive member extending from a top surface of the second semiconductor layer through the second semiconductor layer to contact the first electrode.

A light emitting device according to the embodiment may include a light emitting structure including a first semiconductor layer, an active layer, a second semiconductor layer, and a through hole passing through the first semiconductor layer, the active layer and the second semiconductor layer; a first electrode extending to the outside of the through hole from an inside of the through hole; a second electrode disposed on an outer peripheral region of a bottom surface of the first semiconductor layer and spaced apart from the first electrode while surrounding the lateral side of the first electrode; a conductive member extending from the first electrode onto the second semiconductor layer; and an insulating member contacting the first electrode in the through hole.

DETAILED DESCRIPTION OF THE EMBODIMENTS

Figure 1:
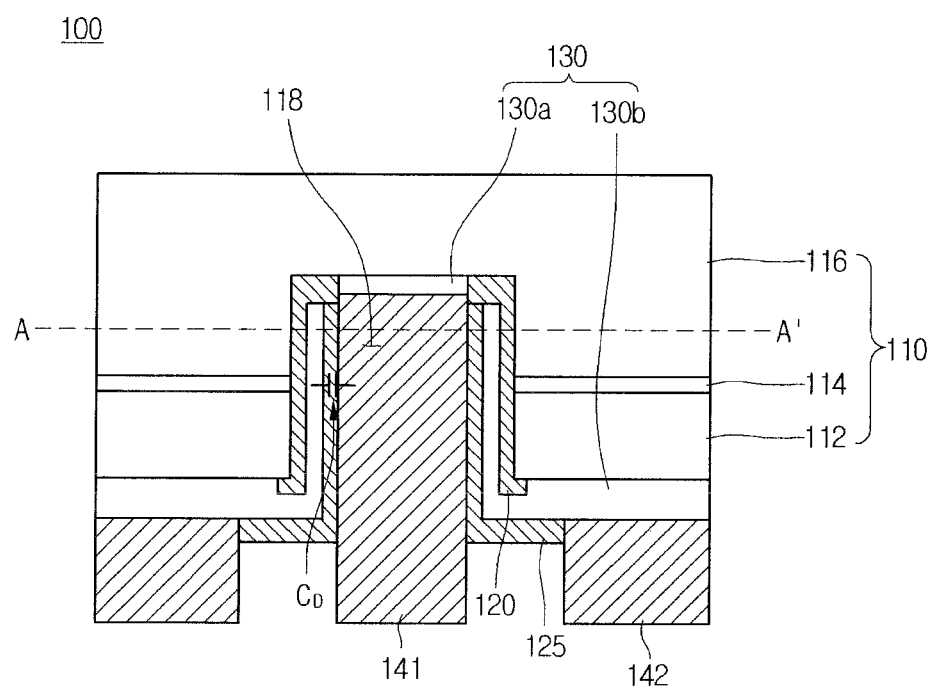
FIG. 1 is a sectional view showing a light emitting device according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

Hereinafter, embodiments will be described with reference accompanying drawings. The thickness and size of each layer shown in the drawings may be exaggerated, omitted or schematically drawn for the purpose of convenience or clarity. In addition, the size of elements does not utterly reflect an actual size.

Figure 2:
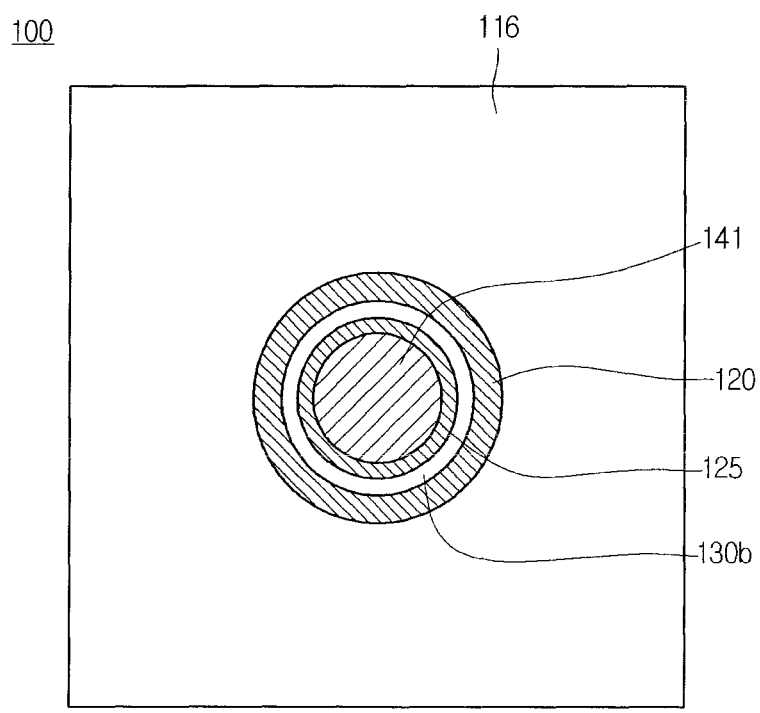
FIG. 2 is a sectional view taken along line A-A' of FIG. 1.
Figure 3:
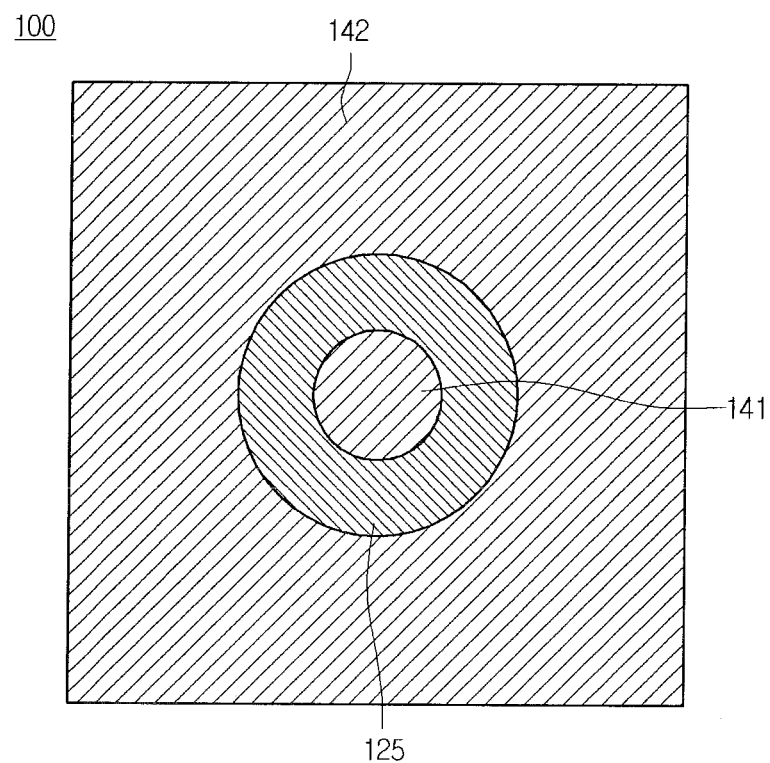
FIG. 3 is a bottom view of the light emitting device shown in FIG. 1.

FIG. 1 is a sectional view showing a light emitting device according to the first embodiment, FIG. 2 is a sectional view taken along line A-A' of FIG. 1, and FIG. 3 is a bottom view of the light emitting device shown in FIG. 1.

Referring to FIGS. 1 to 3, a light emitting device 100 according to the first embodiment includes a first electrode 141, a second electrode 142, insulating members 120 and 125, a reflective member 130 and a light emitting structure 110.

The light emitting structure 110 may include group III-V compound semiconductors, such as GaN, AlN, AlGaN, InGaN, InN, AlInN, AlInGaN, GaAs, GaAsP, or GaP.

The light emitting structure 110 includes a first conductive semiconductor layer 112, an active layer 114 and a second conductive semiconductor layer 116. Electrons and holes are injected into the active layer 114 from the first and second conductive semiconductor layers 112 and 116, and the active layer 114 emits the light through the recombination of holes and electrons.

The first conductive semiconductor layer 112 includes the group III-V compound semiconductor doped with p type dopant. For instance, the first conductive semiconductor layer 112 may include at least one selected from the group consisting of GaN, AlN, AlGaN, InGaN, InN, InAlGaN, AlInN, AlGaAs, GaP, GaAs, GaAsP, and AlGaInP. The p type dopant includes Mg or Zn. The first conductive semiconductor layer 112 can be provided with a single layer or a multiple layer, but the embodiment is not limited thereto.

The active layer 114 may be formed on the first conductive semiconductor layer 112. The active layer 114 emits the light having the wavelength corresponding to the energy band gap of the active layer 114 through the recombination of electrons injected through the first conductive semiconductor layer 112 and holes injected through the second conductive semiconductor layer 116.

The active layer 114 may include one of a single quantum well structure, a multiple quantum well (MQW) structure, a quantum wire structure or a quantum dot structure. The active layer 114 may have a stack structure of well/barrier layers by using the group III-V compound semiconductor materials.

For instance, the active layer 114 may be provided with a stack structure of InGaN well/GaN barrier layers, InGaN well/AlGaN barrier layers, or InGaN well/InGaN barrier layers, in which the band gap of the barrier layer is higher than the band gap of the well layer.

A conductive clad layer can be formed on and/or under the active layer 114. The conductive clad layer may include a GaN-based compound semiconductor. The conductive clad layer may have the band gap higher than that of the barrier layer.

The second conductive semiconductor layer 116 may include group III-V compound semiconductor materials doped with n type dopant. For instance, the second conductive semiconductor layer 116 may include at least one selected from the group consisting of GaN, AlN, AlGaN, InGaN, InN, InAlGaN, AlInN, AlGaAs, GaP, GaAs, GaAsP and AlGaInP. The n type dopant may include Si, Ge, Sn, Se or Te. The second conductive semiconductor layer 116 can be prepared as a single layer or a multiple layer, but the embodiment is not limited thereto.

According to the embodiment, the first conductive semiconductor layer 112 may include an n type semiconductor layer doped with the n type dopant and the second conductive semiconductor layer 116 may include a p type semiconductor layer doped with the p type dopant. In addition, the light emitting structure 110 may include at least one of an N-P junction structure, a P-N junction structure, an N-P-N junction structure, and a P-N-P junction structure.

A cavity 118 is formed in the light emitting structure 110. The cavity 118 is formed by passing through the first conductive semiconductor layer 112 and the active layer 114 such that the second conductive semiconductor layer 116 can be partially exposed through the cavity 118.

The first electrode 141 may be buried in the cavity 118 such that the first electrode 141 makes contact with the second conductive semiconductor layer 116 through the cavity 118. When viewed in a bottom view, the first electrode 141 may have a circular shape or a polygonal shape, but the embodiment is not limited thereto.

The first electrode 141 may have a multi-layer structure. For instance, a first layer of the first electrode 141 formed at an upper portion of the first electrode 141 may include a material capable of forming an ohmic contact with respect to the second conductive semiconductor layer 116, and a third layer of the first electrode 141 formed at a lower portion of the first electrode 141 may include a material having superior adhesive property such that the first electrode 141 can be easily bonded to an external electrode, such as a lead electrode of a light emitting device package. A second layer of the first electrode 141 interposed between the first and third layers of the first electrode 141 may include at least one of a diffusion barrier metal, such as Ni, and a conductive metal having high electric conductivity, such as Cu.

The first electrode 141, for instance, may include at least one selected from the group consisting of Cu, Ag, Al, Ni, Ti, Cr, Pd, Au and Sn and can be provided with a single layer or a multi-layer, but the embodiment is not limited thereto.

The second electrode 142 is spaced apart from the first electrode 141 and makes contact with the first conductive semiconductor layer 112.

The second electrode 142 can be electrically connected to the first conductive semiconductor layer 112 and can supply power to the light emitting structure 110 together with the first electrode 141.

Since the second electrode 142 is spaced apart from the first electrode 141, the electric short between them may be prevented. For instance, the second electrode 142 can be spaced apart from the first electrode 141 by about 10 μm to about 50 μm, but the embodiment is not limited thereto.

As shown in FIG. 2, the second electrode 142 is spaced apart from the lateral side of the first electrode 141 while surrounding the lateral side of the first electrode 141, but the embodiment is not limited thereto. A second insulating layer 125 is formed on a second reflective layer 130b between the first and second electrodes 141 and 142. The electric short between the first and second electrodes 141 and 142 can be prevented by the second insulating layer 125.

The bottom surface of the second electrode 142 is disposed on the same plane as that of the bottom surface of the first electrode 141. That is, the first and second electrodes 141 and 142 have the same height when measured from the bottom surface of the first conductive semiconductor layer 112. Thus, the light emitting device 100 can be mounted on the external electrode, such as the lead electrode of the light emitting device package, through the chip bonding scheme.

According to the chip bonding scheme, in a state in which the first and second electrodes 141 and 142 are disposed against the lead electrodes of the light emitting device package, the first and second electrodes 141 and 142 are bonded with the lead electrodes of the light emitting device package by using soldering materials or a bonding metallic materials. Since the wire bonding process is not necessary, the product yield and the efficiency can be improved when the light emitting device 100 is packaged.

The second electrode 142 may have a multi-layer structure. For instance, a first layer of the second electrode 142 formed at an upper portion of the second electrode 142 may include a material capable of forming an ohmic contact with respect to the first conductive semiconductor layer 112, and a third layer of the second electrode 142 formed at a lower portion of the second electrode 142 may include a material having superior adhesive property such that the second electrode 142 can be easily bonded to the lead electrode of the light emitting device package. A second layer of the second electrode 142 interposed between the first and third layers of the second electrode 142 may include at least one of a diffusion barrier metal, such as Ni, and a conductive metal having high electric conductivity, such as Cu.

The second electrode 142, for instance, may include at least one selected from the group consisting of Cu, Ag, Al, Ni, Ti, Cr, Pd, Au and Sn and can be prepared as a single layer or a multi-layer, but the embodiment is not limited thereto.

As shown in FIG. 3, the first and second electrodes 141 and 142 can be formed over the majority area of the bottom surface of the light emitting device 100. That is, the first and second electrodes 141 and 142 are spaced apart from each other to prevent the electric short and formed over the whole area of the bottom surface of the light emitting device 100 except for a gap spaced apart between the first and second electrodes 141 and 142. However, the embodiment may not limit the structure of the first and second electrodes 141 and 142.

Since any electrode is not formed on the top surface and the lateral surfaces of the light emitting device 100, the light emitted through the top surface and the lateral sides of the light emitting device 100 may not be absorbed into the electrode, so that the light loss may be prevented.

Since the first and second electrodes 141 and 142 are formed over the majority area of the bottom surface of the light emitting device 100, heat generated from the light emitting structure 110 can be instantly transferred to a body of the light emitting device 100 through the first and second electrodes 141 and 142 by way of the lead electrode of the light emitting device package, so that the heat dissipation performance of the light emitting device 100 can be improved.

The first and second electrodes 141 and 142 can support the light emitting structure 110.

The first and second electrodes 141 and 142 receive power from an external power source and supply the power to the first and second conductive semiconductor layers 112 and 116 of the light emitting structure 110.

The first and second electrodes 141 and 142 are disposed on the same plane and protrude to the outside at the same height. Thus, the light emitting device 100 can be mounted on the lead electrode of the light emitting device package through the chip bonding scheme. According to the embodiment, the wire bonding process is not necessary, so that the process efficiency for the light emitting device 100 can be improved.

In addition, the first and second electrodes 141 and 142 may have thicknesses different from each other.

Since the first and second electrodes 141 and 142 are only formed on the bottom surface of the light emitting structure 110 and are not formed on the top surface and the lateral sides of the light emitting structure 110, the light loss caused by the electrodes formed on the top surface and the lateral sides of the light emitting structure 110 can be prevented.

Heat is generated when the light is emitted from the light emitting structure 110. According to the embodiment, the first and second electrodes 141 and 142 are formed on the bottom surface of the light emitting structure 110 and electrically connected to the lead electrode provided in the body of the light emitting device package, so that the heat generated from the light emitting structure 110 can be instantly transferred to the body through the first and second electrodes 141 and 142. Thus, the heat dissipation performance of the light emitting device 100 can be improved.

The reflective layer 130 may include a first reflective layer 130a and a second reflective layer 130b.

The first reflective layer 130a can be formed on the inner bottom surface of the cavity 118 of the light emitting structure 110. That is, the first reflective layer 130a can be formed between the bottom surface of the second conductive semiconductor layer 116 disposed in the cavity 118 and the top surface of the first electrode 141.

The second reflective layer 130b can be formed on the inner lateral side of the cavity 118 of the light emitting structure 110. That is, the second reflective layer 130b can be formed between the lateral sides of the first conductive semiconductor layer 112, the active layer 114 and the second conductive semiconductor layer 116 disposed in the cavity 118 and the lateral side of the first electrode 141 and between the bottom surface of the first conductive semiconductor layer 112 and the top surface of the second electrode 142.

In detail, the second reflective layer 130b is formed on the bottom surface of the first conductive semiconductor layer 112 while extending toward the lateral side of the first conductive semiconductor layer 112 disposed in the cavity 118, the active layer 114 disposed in the cavity 118 and the lateral side of the second conductive semiconductor layer 116.

If the ohmic contact is not formed between the second conductive semiconductor layer 116 and the first electrode 141, the first reflective layer 130a may include a material capable of forming an ohmic contact with respect to the first conductive semiconductor layer 112.

If the ohmic contact is not formed between the first conductive semiconductor layer 112 and the second electrode 142, the second reflective layer 130b may include a material capable of forming an ohmic contact with respect to the first conductive semiconductor layer 112.

For instance, the first and second reflective layers 130a and 130b may include a metal or a metal alloy including at least one selected from the group consisting of Ag, Ni, Al, Rh, Pd, Ir, Ru, Mg, Zn, Pt, Au, and Hf. In addition, the first and second reflective layers 130a and 130b can be prepared as a multi-layer by using the metal or an alloy and a light transmittive material. The light transmittive material my include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), and GZO (gallium zinc oxide). If the first and second reflective layers 130a and 130b are prepared as multi-layers, respectively, each of the first and second reflective layers 130a and 130b may include IZO/Ni, AZO/Ag, IZO/Ag/Ni, or AZO/Ag/Ni.

The first and second reflective layers 130a and 130b can be formed by using the same material or different materials, and the embodiment is not limited thereto.

In order to diminish the amount of light absorbed in the first and second electrodes 141 and 142, the second reflective layer 130b is formed around the first and second electrodes 141 and 142. Thus, the light emitted from the light emitting structure 110 can be reflected as much as possible, so that the light extraction efficiency of the light emitting device can be improved.

The insulating member may include first and second insulating layers 120 and 125.

The first insulting layer 120 can be formed between a lateral side of the second reflective layer 130b and laterals sides of the first conductive semiconductor layer 112, the active layer 114 and the second conductive semiconductor layer 116 in the cavity 118.

The second insulting layer 125 can be formed between a lateral side of the first electrode 141 and a lateral side of the second reflective layer 130b in the cavity 118, and on the bottom surface of the first conductive semiconductor layer 112 between the first electrode 141 and the second electrode 142 in the cavity 118.

The first and second insulting layers 120 and 125 are connected to each other at the bottom surface of the second conductive semiconductor layer 116 in the cavity 118.

The first and second insulting layers 120 and 125 may surround both lateral sides and the top surface of the second reflective layer 130b formed in the cavity 118. In detail, the second reflective layer 130b is formed on the top surface of the first conductive semiconductor layer 112 and extends between the first and second insulating layers 120 and 125 in the cavity 118.

The first insulating layer 120 prevents the electric short from occurring among the first conductive semiconductor layer 112, the active layer 114 and the second conductive semiconductor layer 116 caused by the second reflective layer 130b formed in the cavity 118.

The second insulating layer 125 prevents the electric short between the first and second electrodes 141 and 142 and between the first electrode 141 and the second reflective layer 130b.

The first and second insulating layers 120 and 125 may include a material having light transmittive and electric insulating properties. For instance, the first and second insulating layers 120 and 125 may include at least one selected from the group consisting of $SiO_2$, $SiO_x$, $SiO_xN_y$, $Si_3N_4$, $Al_2O_3$ and $TiO_x$, but the embodiment is not limited thereto.

The first and second insulating layers 120 and 125 can be formed by using the same material or different materials.

The first and second insulating layers 120 and 125 may serve as dielectric substances between the light emitting structure 110 including the conductive material and the first electrode 141, so a capacitor $C_D$ (see, FIG. 1) may be formed.

The capacitor $C_D$ may have the withstanding voltage effect to protect the light emitting structure 100 when the ESD (electrostatic discharge) occurs as a reverse voltage is applied to the light emitting device 110.

Hereinafter, the capacitor $C_D$ will be described in detail.

Figure 4:
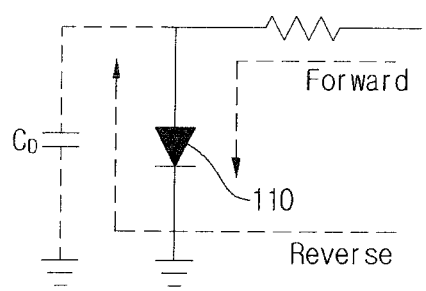
FIG. 4 is an equivalent circuit view of a light emitting device according to the embodiment.

FIG. 4 is an equivalent circuit view of the light emitting device according to the embodiment.

Referring to FIG. 4, the capacitor $C_D$ is connected in parallel to the light emitting structure 110. The capacitor $C_D$ may be present at the first insulating layer 120 between the light emitting structure 110 and the second reflective layer 130b and at the second insulating layer 125 between the second reflective layer 130b and the first electrode 141. The first conductive semiconductor layer 112 of the light emitting structure 110 and the second reflective layer 130b are electrically connected to each other so that equipotential may occur between the light emitting structure 110 and the second reflective layer 130b. Thus, the capacitor $C_D$ may not be present at the first insulating layer 120. Actually, the capacitor $C_D$ is present at the second insulating layer 125 between the second reflective layer 130b and the first electrode 141.

If a forward voltage is applied to the light emitting device 100, the current is applied to the light emitting device 110, so the light emitting device 110 emits the light. However, if a reverse voltage is applied to the light emitting device 100 due to the ESD, a part of the current is applied to the second conductive semiconductor layer 116 of the light emitting structure through the first electrode 141, and the remaining current is applied to the first conductive semiconductor layer 112 of the light emitting structure 110 through the capacitor $C_D$. Thus, the current applied to the first conductive semiconductor layer 112 through the second conductive semiconductor layer 116 and the active layer 114 is offset by the current applied to the second conductive semiconductor layer 116 through the first conductive semiconductor layer 112 and the active layer 114, so that the amount of current applied to the active layer 114 is reduced as much as possible, thereby preventing the active layer 114 of the light emitting structure 110 from being damaged by the breakdown voltage.

At this time, when the reverse voltage is applied due to the ESD, the amount of current applied to the active layer 114 of the light emitting structure 110 may be reduced as the total capacitance $C_{Tot}$ is increased, thereby attenuating the impact upon the ESD.

This can be expressed as follows.

$Q_{Dis}=C_{ESD}V_{ESD}$ ($Q_{Dis}$ is amount of charges upon ESD, and $C_{ESD}$ is capacitance upon ESD)

$$I=dQ/dt=\Delta Q/\tau=Q_{Dis}/(RC_{Tot}) \therefore C_{Tot}\uparrow \rightarrow I$$

That is, when the reverse voltage is applied due to the ESD, the current I flowing through the active layer 114 of the light emitting structure 110 may be lowered as the total capacitance $C_{Tot}$, that is, the capacitance of the second insulating layer 125 formed between the first electrode 141 and the second reflective layer 130b is increased, so that the impact can be attenuated.

In this regard, the first and second insulating layers 120 and 125 may include insulating materials having high electric constant ∈ to increase the capacitance. For instance, the first and second insulating layers 120 and 125 may include $TiO_2$, $BaTiO_3$ or $SrTiO_3$, but the embodiment is not limited thereto.

Figure 5:
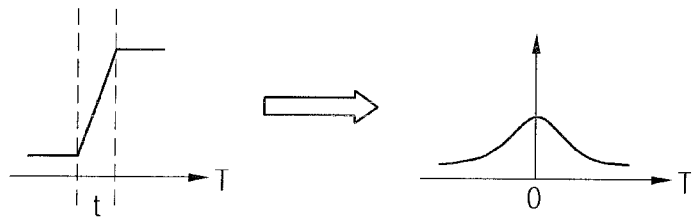
FIG. 5 is a schematic view showing a waveform upon the electrostatic discharge of a light emitting device according to the embodiment.

FIG. 5 is a schematic view showing a waveform upon the electrostatic discharge of the light emitting device according to the embodiment.

As shown in FIG. 5, the pulse waveform may have the high-frequency component through the Fourier transform. In addition, the intensity of the high-frequency component may be increased as the rising period (t) is steep. This can be expressed as follows.

Impedance: $Z=Z_R+jZ_{Im}$ ($Z_R$ is real impedance, j is factor of imaginary part, and $Z_{Im}$ is impedance caused by capacitor), $Z_{Im,C}=1/(j\omega C)$, ($\omega=2\pi f$)

Based on the above formula, it can be understood that the capacitance is increased as the reverse voltage is excessively applied to the light emitting device 100 due to the ESD, so that the withstanding voltage characteristics of the light emitting device 100 can be improved. That is the present invention can provide the light emitting device 100 having superior withstanding voltage characteristics against the excessive current.

Hereinafter, the method of manufacturing the light emitting device 100 according to the embodiment will be described in detail. In the following description, details of the elements and structures that have been previously described will be omitted or simplified to avoid redundancy.

FIGS. 6A to 6H are sectional views showing the method of manufacturing the light emitting device according to the embodiment.

Figure 6A:
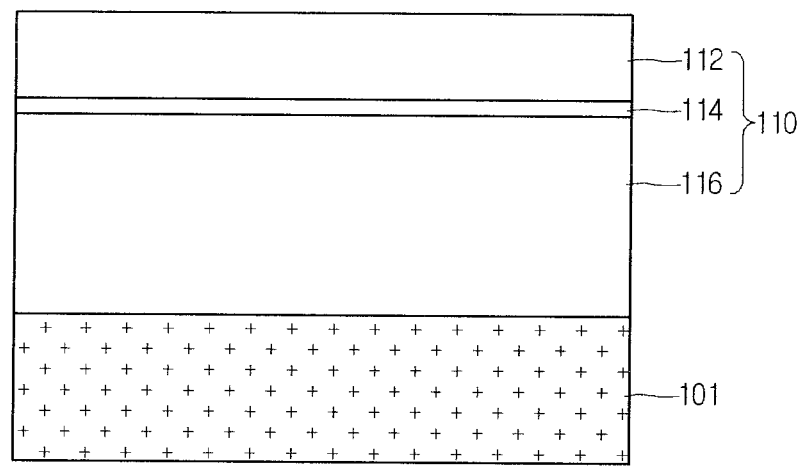
FIGS. 6A to 6H are sectional views showing a method for manufacturing a light emitting device according to the embodiment.

Referring to FIG. 6A, the light emitting structure 110 is formed on a substrate 101.

The substrate 101 may include at least one selected from the group consisting of $Al_2O_3$, SiC, GaN, Si, ZnO, AlN, GaAs, $\beta$-$Ga_2O_3$, GaP, InP, and Ge.

The light emitting structure 110 can be formed by sequentially depositing the second conductive semiconductor layer 116, the active layer 114, and the first conductive semiconductor layer 112 on the substrate 101. The second conductive semiconductor layer 116 is an n type semiconductor layer including n type dopant and the first conductive semiconductor layer 112 is a p type semiconductor layer including p type dopant, but the embodiment is not limited thereto.

The light emitting structure 110 can be formed using MOCVD (metal organic chemical vapor deposition), CVD (chemical vapor deposition), PECVD (plasma-enhanced chemical vapor deposition), MBE (molecular beam epitaxy), or HVPE (hydride vapor phase epitaxy), but the embodiment is not limited thereto.

A buffer layer (not shown) or an undoped semiconductor layer (not shown) can be formed between the substrate 101 and the second conductive semiconductor layer 116 to attenuate the lattice mismatch and difference of thermal coefficient between the substrate 101 and the second conductive semiconductor layer 116 and to improve the crystalline property of the light emitting structure 110.

Figure 6B:
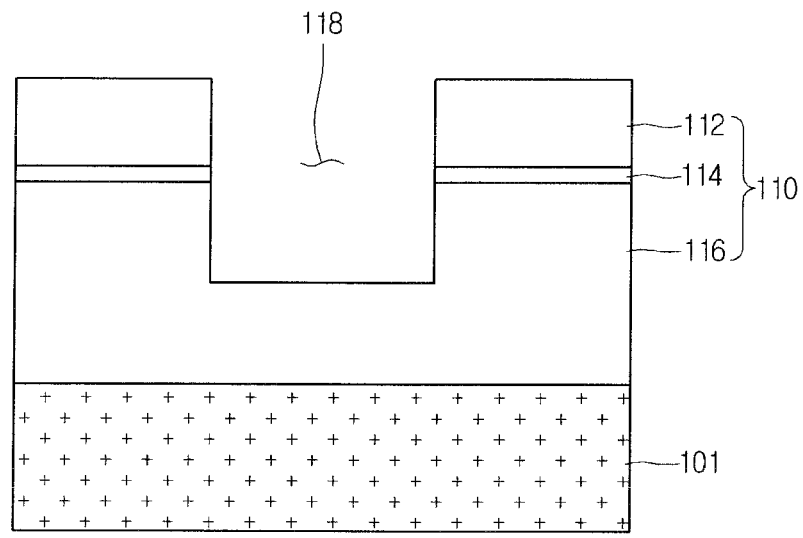

Referring to FIG. 6B, the center region of the light emitting structure 110 is selectively removed such that the top surface of the second conductive semiconductor layer 116 can be partially exposed, thereby forming the cavity 118. A part of the top surface of the second conductive semiconductor layer 116, a lateral side of the active layer 114, and a lateral side of the first conductive semiconductor layer 112 are exposed through the cavity 118.

The cavity 118 can be formed using the wet etching, the dry etching or the laser process, but the embodiment is not limited thereto. An inner wall of the cavity 118 can be formed slantingly or perpendicular to the top surface of the second conductive semiconductor layer 116 through the etching process or the laser process, but the embodiment is not limited thereto.

The cavity 118 can be formed by passing through the first conductive semiconductor layer 112 and the active layer 114 such that the second conductive semiconductor layer 116 can be exposed.

Figure 6C:
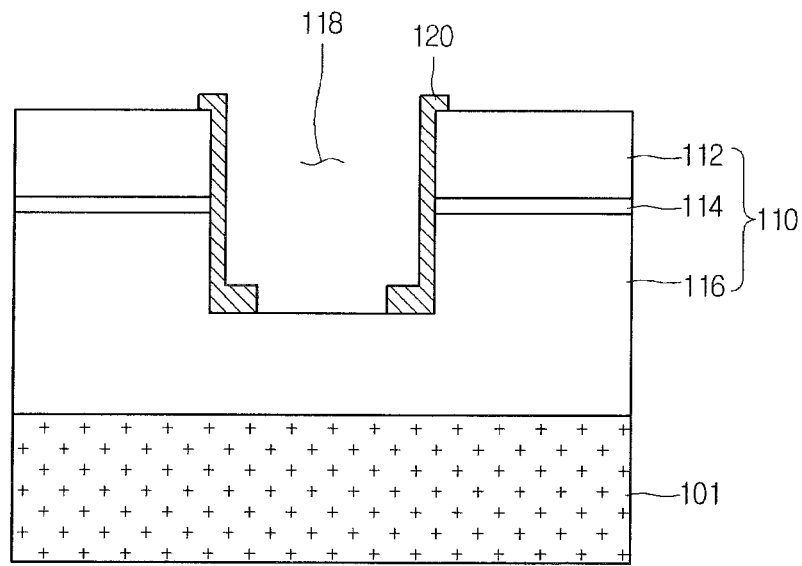

Referring to FIG. 6C, the first insulting layer 120 is formed in the cavity 118. In detail, the first insulting layer 120 extends from a part of the top surface of the second conductive semiconductor layer 116 to a part of a top surface of the first conductive semiconductor layer 112 by passing through the lateral sides of the second conductive semiconductor layer 116, the active layer 114 and the first conductive semiconductor layer 112.

The first insulating layer 120 can be formed using the deposition process, such as E-beam evaporation, sputtering, and PECVD, but the embodiment is not limited thereto.

For instance, the first insulating layer 120 can be formed by performing the deposition process after forming a mask (not shown) on the cavity 118. Thus, the shape of the first insulating layer 120 may vary depending on the shape of the mask, but the embodiment may not limit the shape of the first insulating layer 120.

Figure 6D:
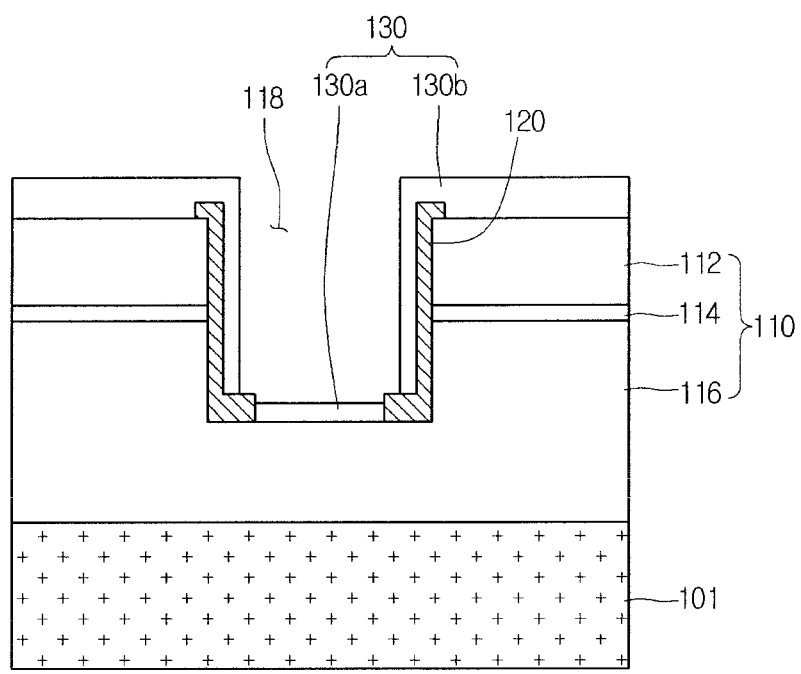

Referring to FIG. 6D, the first and second reflective layers 130a and 130b are formed simultaneously or independently.

The first reflective layer 130a can be formed on the top surface of the second conductive semiconductor layer 116 except for an area where the first insulating layer 120 is formed. In detail, the first reflective layer 130a is formed on the top surface of the second conductive semiconductor layer 116 exposed between the first insulating layers 120.

The second reflective layer 130b can be formed on the top surface of the first insulating layer 120 formed in the cavity 118, the top surface of the first insulating layer formed on a part of the top surface of the first conductive semiconductor layer 112, and the top surface of the first conductive semiconductor layer 112. In detail, the second reflective layer 130b may extend over the whole area of the first conductive semiconductor layer 112 from the top surface of the first insulating layer 120 formed in the cavity 118. An end portion of the first insulating layer 120 formed on a part of the top surface of the second conductive semiconductor layer 116 may protrude in the horizontal direction more than the end portion of the second reflective layer 130b formed in the cavity 118. Thus, the second insulating layer 125 can be connected to the first insulating layer 120 in the subsequent process.

The first insulating layer 120 prevents the electric short from occurring among the first conductive semiconductor layer 112, the active layer 114 and the second conductive semiconductor layer 116 of the light emitting structure 110 caused by the second reflective layer 130b formed in the cavity 118.

The first and second reflective layers 130a and 130b can be formed using the plating process or the deposition process, such as E-beam evaporation, sputtering, and PECVD, but the embodiment is not limited thereto. For instance, the first and second reflective layers 130a and 130b can be formed by performing the deposition process after forming a mask (not shown) on the cavity 118. Thus, the shape of the first and second reflective layers 130a and 130b may vary depending on the shape of the mask, but the embodiment may not limit the shape of the first and second reflective layers 130a and 130b.

Figure 6E:
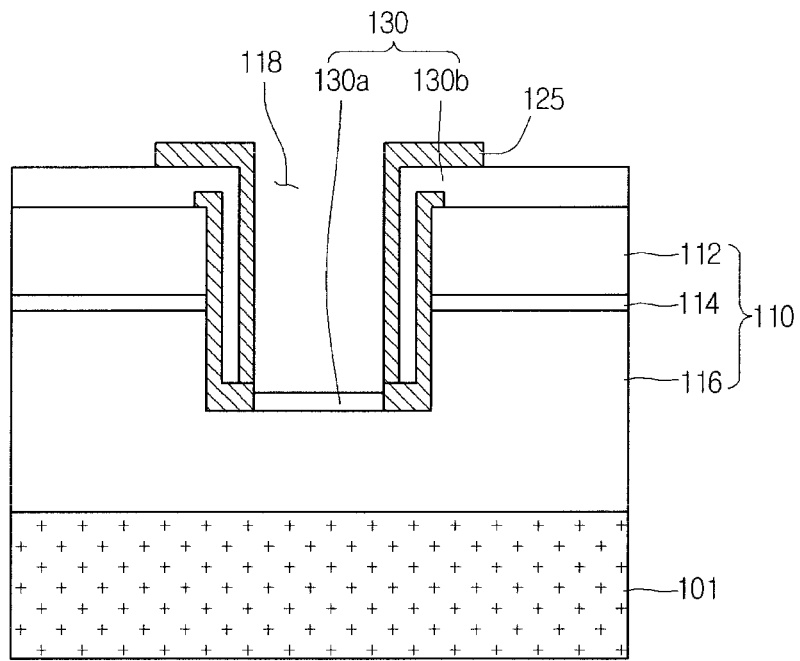

Referring to FIG. 6E, the second insulating layer 125 is formed in such a manner that the second insulating layer 125 is connected to the first insulating layer 120, which is formed on the top surface of the second conductive semiconductor layer 116, that is, the bottom surface of the cavity 118, while extending to a part of the second reflective layer 130b formed on the top surface of the first conductive semiconductor layer 112 in the cavity 118.

The second insulating layer 125 surrounds the entire surface of the second reflective layer 130b formed in the cavity 118. Thus, the second insulating layer can prevent the electric short between the first electrode 141 and the second reflective layer 130b.

The second insulating layer 125 may extend from the second insulating layer 125 formed in the cavity 118 to a part of the second reflective layer 130b formed on the top surface of the first conductive semiconductor layer 112. Thus, the second insulating layer 125 can prevent the electric short between the first and second electrodes 141 and 142.

Similar to the first insulating layer 120, the second insulating layer 125 can be formed using the deposition process, such as E-beam evaporation, sputtering, and PECVD.

Figure 6F:
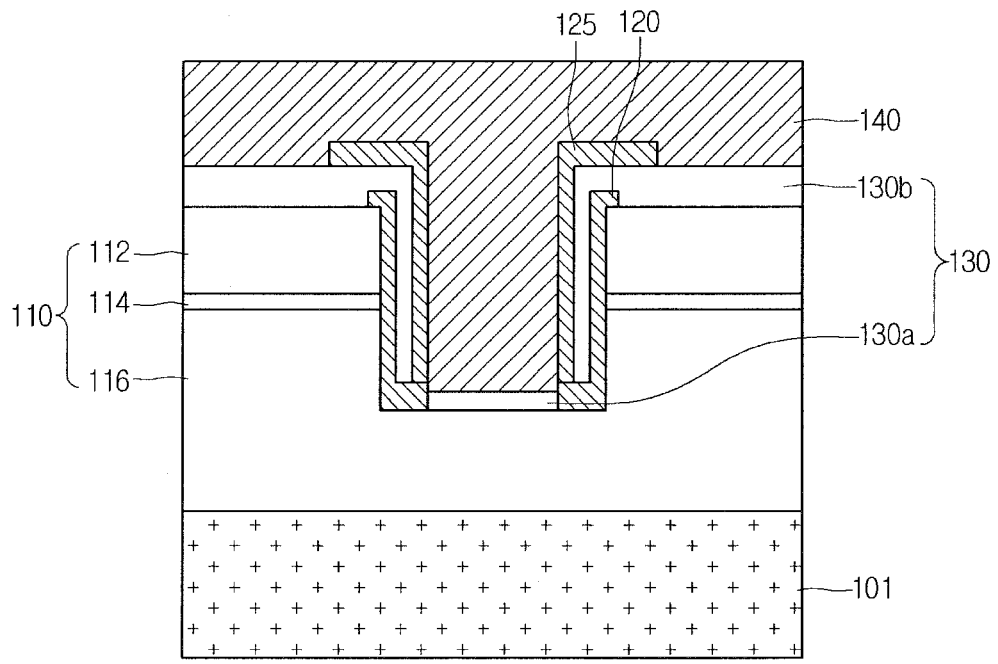

Referring to FIG. 6F, a metal layer 140 can be formed on the entire top surface of the light emitting structure 110 including the cavity 118 in such a manner that at least the cavity 118 can be filled with the metal layer 140. In detail, the metal layer 140 can be formed on the top surfaces of the second insulating layer 125 and the second reflective layer 130b while filling the cavity 118. In the cavity 118, the metal layer 140 makes contact with the top surface of the first reflective layer 130a formed on the bottom surface of the cavity 118 and the top surface of the second insulating layer 125 formed on the inner sidewall of the cavity 118.

The metal layer 140 is primarily filled in the cavity 118 and then formed on the top surfaces of the second insulating layer 125 and the second reflective layer 130b formed on the top surface of the light emitting structure such that the metal layer 140 has a predetermined thickness. The thickness of the metal layer 140 may vary depending on the packing structure of the light emitting device package, so the embodiment may not limit the thickness of the metal layer 140.

The metal layer 140 can be formed using the plating process, such as an electroplating or electroless plating, or the deposition process, but the embodiment is not limited thereto.

Figure 6G:
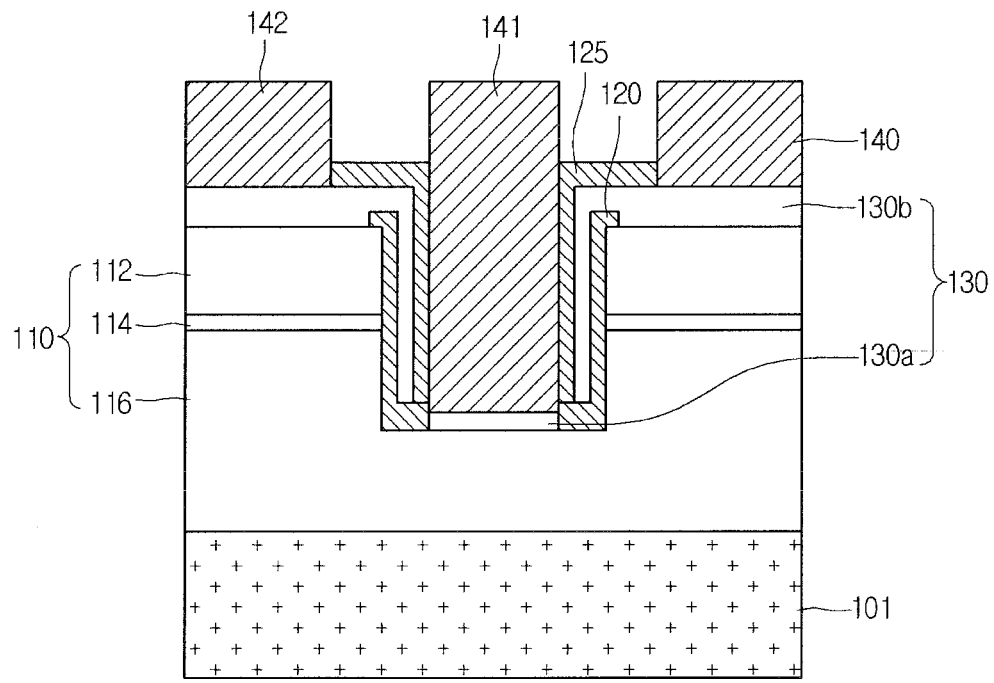

Referring to FIG. 6G, the metal layer 140 is selectively removed such that the top surface of the second insulating layer 125, which is formed on the top surface of the light emitting structure 110, can be exposed, thereby forming the first and second electrodes 141 and 142. A gap is formed between the first and second electrodes 141 and 142 to prevent the electric short from occurring between the first and second electrodes 141 and 142. The gap may have a size of about 10 μm to about 50 μm, but the embodiment is not limited thereto. If the size of the gap is less than 10 μm, the electric short may occur between the first and second electrodes 141 and 142. If the size of the gap exceeds 50 μm, the electric characteristics and interfacial characteristics between the light emitting structure 110 and the first and second electrodes 141 and 142 may be degraded.

The first and second electrodes 141 and 142 can be formed by performing the wet etching or the dry etching along a mask (not shown) formed on the metal layer 140, but the embodiment is not limited thereto.

Figure 6H:
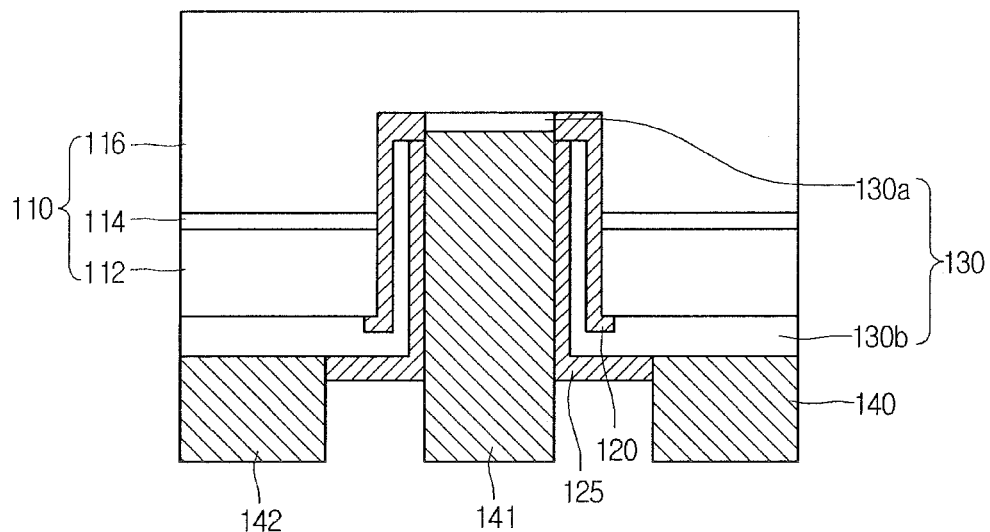

Referring to FIG. 6H, the substrate 101 is removed, so that the light emitting device 100 according to the embodiment can be manufactured.

The substrate 101 can be removed through at least one of the LLO (laser lift off), CLO (chemical lift off) and physical polishing, but the embodiment is not limited thereto.

In order to ensure the reliability of the manufacturing process, the substrate 101 is preferably removed after the first and second electrodes 141 and 142 have been formed, but the embodiment may not limit the sequence of the manufacturing process.

After the substrate 101 has been removed, the etching process may be performed to remove residues of the substrate 101 from the top surface of the light emitting structure 110 and to form the roughness or a concavo-convex shape in order to improve the light extraction efficiency.

Figure 7A:
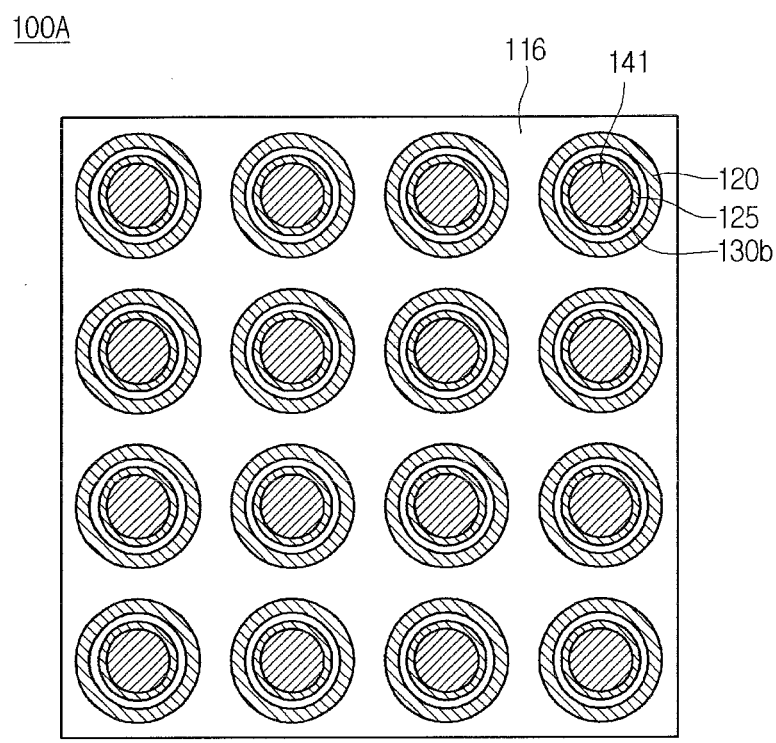
FIGS. 7A and 7B views showing a light emitting device according to the second embodiment.
Figure 7B:
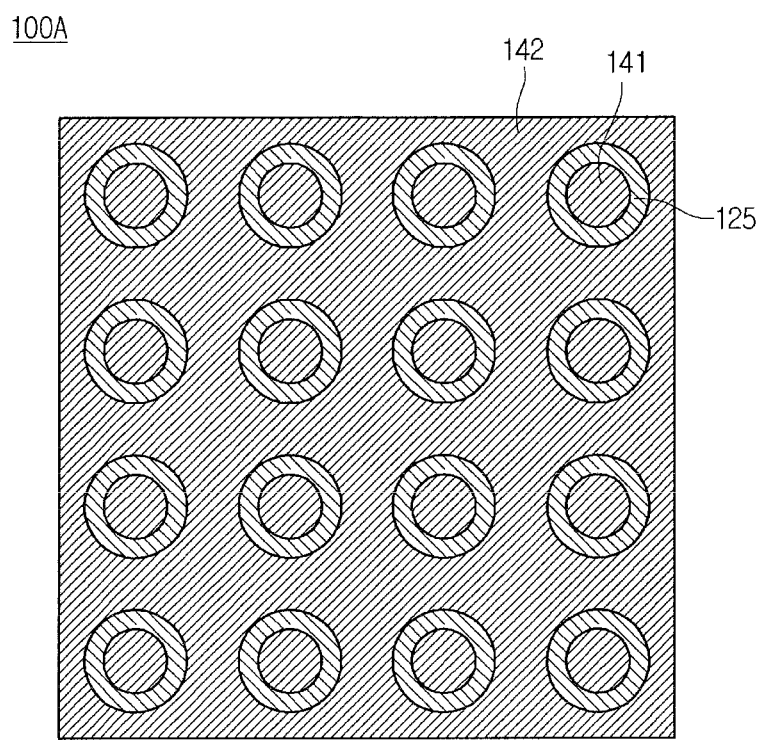

FIGS. 7A and 7B are views showing a light emitting device according to the second embodiment, in which FIG. 7A is an enlarged view of A-A' section shown in FIG. 1, and FIG. 7B is an enlarged bottom view of the light emitting device shown in FIG. 1.

Referring to FIGS. 7A and 7B, the light emitting device 100A according to the second embodiment includes a plurality of first electrodes 141 formed in the form of a matrix. The second insulating layer 125 is formed around the first electrodes 141.

The second electrode 142 is formed on the bottom surface of the light emitting device 100A except for the area where the first electrodes 141 and the second insulating layer 125 are formed.

The light emitting device 100A according to the second embodiment may include a plurality of light emitting devices 110 having the structure identical to the structure of the light emitting device 110 shown in FIG. 1.

Only one of first electrodes 141 is provided for each light emitting device 110.

The second electrode 142 is provided for each light emitting device 110 and extends from the light emitting structure such that the second electrodes 142 can be connected to each other.

Otherwise, the second electrode 142 is provided for each light emitting device 110 in such a manner that the second electrode 142 can be spaced apart from another second electrode 142 provided in another light emitting structure. The structure of the second electrode 142 may be changed according to the structure of the light emitting device package, so the embodiment may not limit the structure of the second electrode 142.

The light emitting structures 110 of the light emitting device 100A according to the second embodiment can be connected to each other. In detail, the light emitting device 100A according to the second embodiment includes one large-size light emitting structure 110, a plurality of first electrodes 141 arranged on the bottom surface of the light emitting structure 110 in the form of the matrix, a plurality of second insulating layers 125 around the first electrodes 141, and one second electrode 142 formed on the bottom surface of the light emitting structure 110 except for the area where the first electrodes 141 and the second insulating layers 125 are formed.

Thus, even if the light emitting structure 110 has a large size, the power can be easily supplied through the first electrodes 141 formed on the bottom surface of the light emitting structure and the large-size second electrode 142, so that the current can uniformly spread over the whole area of the large-size light emitting structure 110, thereby remarkably improving the reliability of the product.

The first electrodes 141 can be arranged in the form of the matrix as shown in FIGS. 7A and 7B or can be arranged in various configurations, and the embodiment may not limit the configuration of the first electrodes 141.

Figure 8:
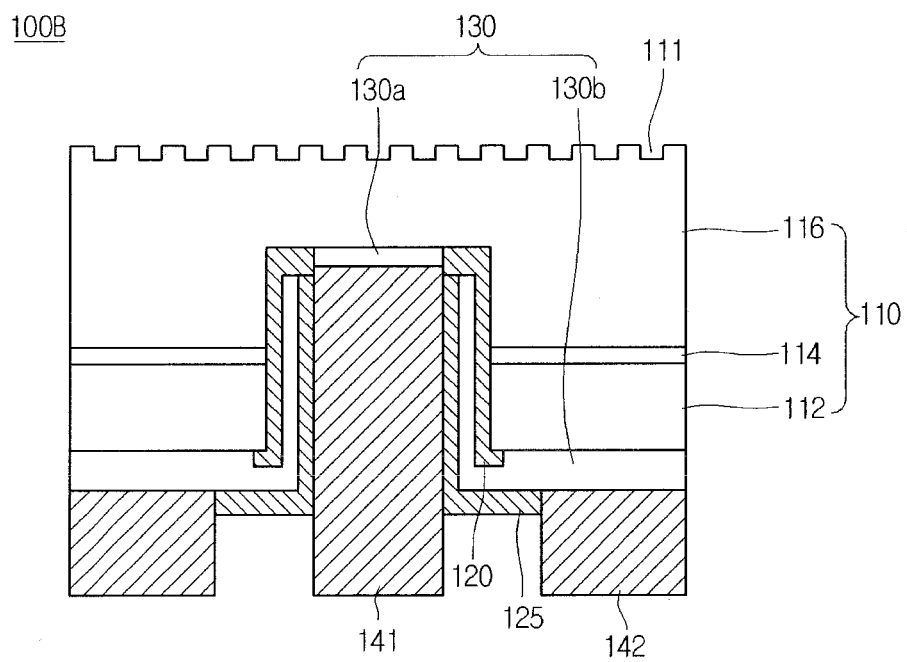
FIG. 8 is a sectional view showing a light emitting device according to the third embodiment.

FIG. 8 is a sectional view of a light emitting device according to the third embodiment.

The light emitting device 100B according to the third embodiment is similar to the light emitting device 100 according to the first embodiment except that the roughness or the concavo-convex shape is formed on the top surface of the light emitting structure. Thus, in the following description of the third embodiment, details of the elements and structures that have been described in the first embodiment will be omitted in order to avoid redundancy and the same reference numerals will be used to refer to the same elements.

Referring to FIG. 8, the light emitting device 100B according to the third embodiment includes the roughness or the concavo-convex structure 111 formed on the top surface of the light emitting structure 110. In detail, the roughness or the concavo-convex structure 111 is formed over the whole area of the top surface of the second conductive semiconductor layer 116 of the light emitting structure 110.

The roughness or the concavo-convex structure 111 is formed using the wet etching process or the dry etching process such that the roughness or the concavo-convex structure 111 may include random patterns or regular patterns, but the embodiment is not limited thereto.

The roughness or the concavo-convex structure 111 may have a predetermined period, which may be determined according to the wavelength of the light emitted from the light emitting structure 110. For instance, the roughness or the concavo-convex structure 111 may include a photonic crystal structure having a period of 200 nm to 300 nm.

Due to the roughness or the concavo-convex structure 111, the light in the light emitting structure 110 can be emitted to the outside through the total reflection, so that the light extraction efficiency of the light emitting device 100B can be improved.

Figure 9:
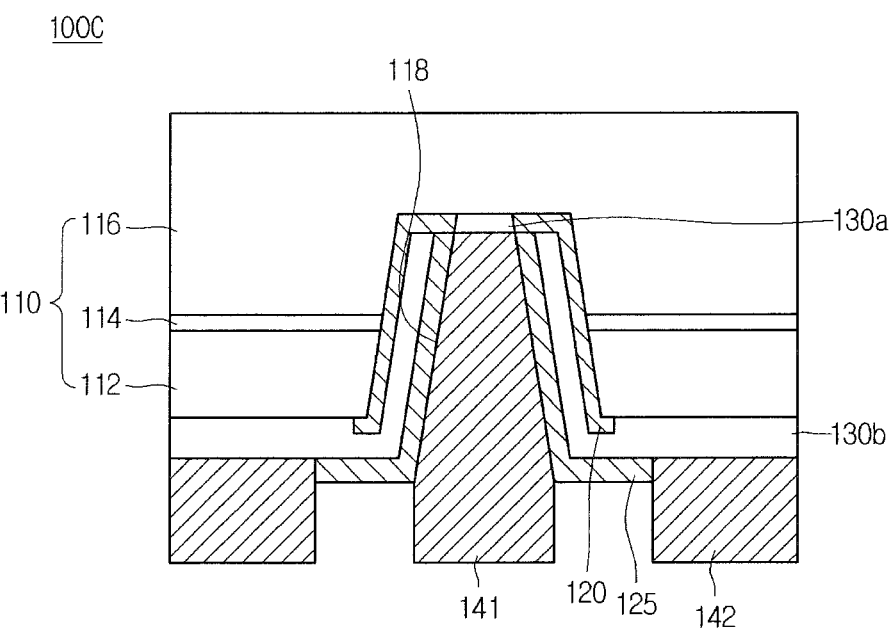
FIG. 9 is a sectional view showing a light emitting device according to the fourth embodiment.

FIG. 9 is a sectional view of a light emitting device according to the fourth embodiment.

The light emitting device 100C according to the fourth embodiment is similar to the light emitting device 100 according to the first embodiment except that the inner wall of the cavity 118 is inclined with respect to the bottom surface of the cavity. Thus, in the following description of the fourth embodiment, details of the elements and structures that have been described in the first embodiment will be omitted in order to avoid redundancy and the same reference numerals will be used to refer to the same elements.

Referring to FIG. 9, the light emitting device 100C according to the fourth embodiment includes the cavity 118 formed in the light emitting structure 110. The cavity 118 can be formed by selectively removing the light emitting structure 110. The lateral side of the first conductive semiconductor layer 112, the lateral side of the active layer 114 and the lateral side and the bottom surface of the second conductive semiconductor layer 116 are exposed to the outside through the inner sidewall of the cavity 118.

The inner sidewall of the cavity 118 is inclined with respect to the bottom surface of the cavity 118, that is, the bottom surface of the second conductive semiconductor layer 116. In detail, the inner sidewall of the cavity 118 is inclined with respect to the bottom surface of the second conductive semiconductor layer 116 in such a manner that the width of the cavity 118 can be gradually enlarged from the top to the bottom of the light emitting structure 110.

The second reflective layer 130b formed in the cavity 118 is also inclined with respect to the bottom surface of the second conductive semiconductor layer 116.

Thus, the light generated from the active layer 114 is reflected upward by the inclined second reflective layer 130b, so that the light extraction efficiency of the light emitting device 100C can be improved.

The cavity 118 can be formed using the dry etching, the wet etching, or the laser process.

Figure 10:
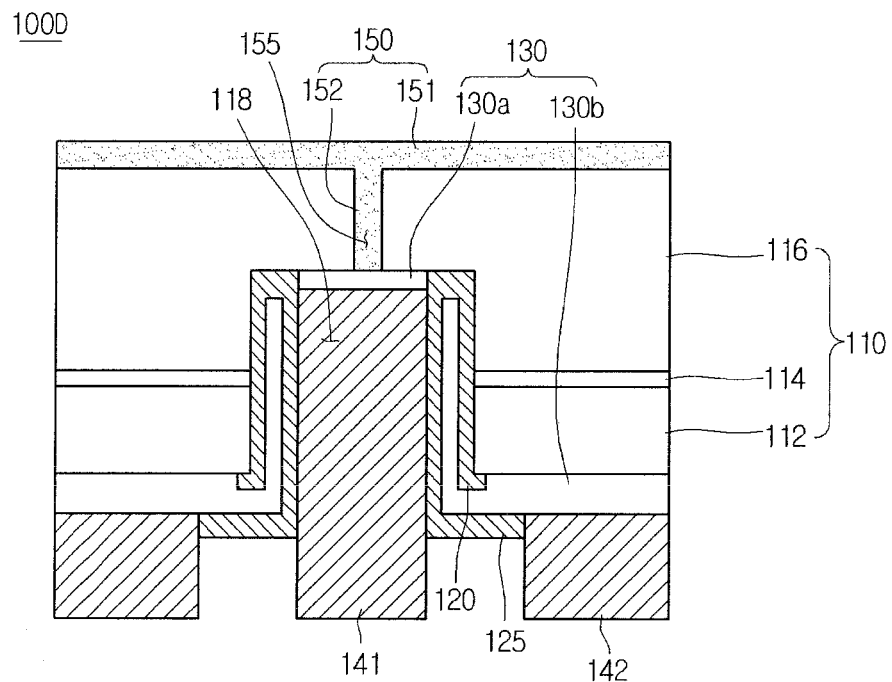
FIG. 10 is a sectional view showing a light emitting device according to the fifth embodiment.

FIG. 10 is a side sectional view of a light emitting device according to the fifth embodiment.

The light emitting device 100D according to the fifth embodiment is similar to the light emitting device 100 according to the first embodiment except that a conductive member 150 is formed on the top surface of the light emitting structure 110. Thus, in the following description of the fifth embodiment, details of the elements and structures that have been described in the first embodiment will be omitted in order to avoid redundancy and the same reference numerals will be used to refer to the same elements.

Referring to FIG. 10, the light emitting device 100D according to the fifth embodiment includes the conductive member 150 formed in a second cavity 155 of the light emitting structure 110 and on the top surface of the light emitting structure 110.

The first cavity 118 is formed at the lower portion of the light emitting structure 110. Since the first cavity 118 has already been described, the detailed description thereof will be omitted.

The second cavity 155 can be formed by selectively removing the light emitting structure 110 from the upper portion of the light emitting structure 110 until the first reflective layer 130a is exposed. A part of the top surface of the second conductive semiconductor layer 116 is exposed through the bottom surface of the second cavity 155. The second cavity 155 can be formed by passing through the second conductive semiconductor layer 116. Thus, the second cavity 155 is formed in the second conductive semiconductor layer 116.

The conductive member 150 extends from an inside of the second cavity 155 formed in the light emitting structure 110 such that the conductive member 150 can be formed on the entire top surface of the light emitting structure 110. In detail, the conductive member 150 extends from the inside of the second cavity 155 formed above the second conducive semiconductor layer 116 of the light emitting structure 110 such that the conductive member 150 can be formed on the entire top surface of the second conducive semiconductor layer 116.

The conductive member 150 may include first and second conductive layers 151 and 152.

The first conductive layer 151 is formed on the top surface of the second conducive semiconductor layer 116 and the second conductive layer 152 extends from the first conductive layer 151 to the inside of the second cavity 155 formed in the second conducive semiconductor layer 116 to make contact with the first reflective layer 130a. If the first reflective layer 130a is not formed, the second conductive layer 152 is electrically connected to the first electrode 141, directly. Since the first reflective layer 130a has conductivity, the second conductive layer 152 can be electrically connected to the first electrode 141 through the first reflective layer 130a.

The second conductive layer 152 can be formed on the insulating members 120 and 125 as well as the first reflective layer 130a. The embodiment may not limit the diameter of the second conductive layer 152.

The conductive member 150 may include a material having light transmittive and electric conductive properties. In detail, the conductive member 150 can be prepared as a single layer or a multiple layer by using at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, Ni, Ag and Au.

The first conductive layer 151 is formed on the top surface of the light emitting structure 110. In detail, the first conductive layer 151 is formed on the top surface of the second conductive semiconductor layer 116 at the thickness of about 100 nm to about 500 nm. The conductive member 150 including the first and second conductive layers 151 and 152 can be formed with a uniform thickness through the plating process or the deposition process, such as E-beam evaporation, sputtering, and PECVD.

The current supplied to the first electrode 141 can be spread over the whole area of the second conductive semiconductor layer 116 by the conductive member 150 including the first and second conductive layers 151 and 152, so that the light can be uniformly generated from the whole area of the active layer 114 of the light emitting structure 110. Thus, the light emitting efficiency of the light emitting device 100D can be improved.

According to the related art, the electrode is locally formed on the top surface of the light emitting structure, so the current is concentrated onto a predetermined region of the light emitting structure. For this reason, the light may be generated from a part of the active layer.

However, according to the embodiment, the current supplied to the first electrode 141 is spread over the whole area of the first conductive layer 151 through the second conductive layer 152, so that the current can be uniformly supplied to the second conductive semiconductor layer 116 from the whole area of the first conductive layer 151. Thus, the light can be uniformly generated from the whole area of the active layer 114.

Hereinafter, the method for manufacturing the light emitting device according to the fifth embodiment will be described in detail. In the following description, the details of the elements and structures that have been previously described will be omitted or simplified in order to avoid redundancy.

FIGS. 11A to 11J are sectional views showing the manufacturing procedure for the light emitting device according to the fifth embodiment.

The manufacturing procedure shown in FIGS. 11A to 11H are substantially identical to the manufacturing procedure shown in FIGS. 6A to 6H. In this regard, the brief description will be made with respect to FIGS. 11A to 11H.

Figure 11A:
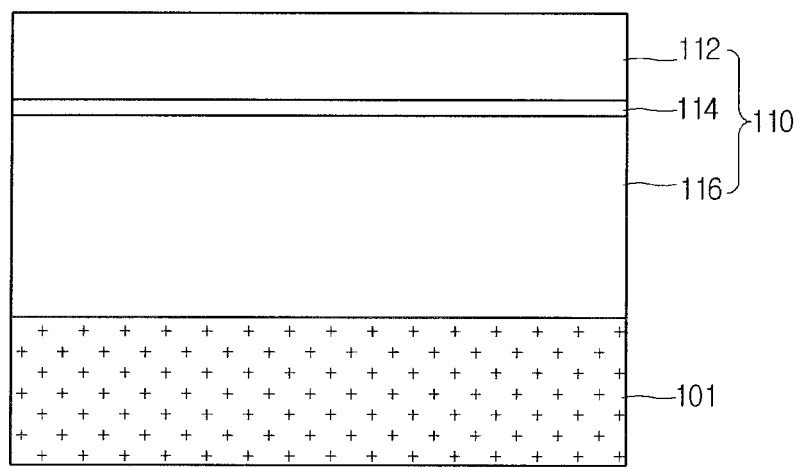
FIGS. 11A to 11J are sectional views showing the manufacturing procedure for a light emitting device according to the fifth embodiment.

Referring to FIG. 11A, the light emitting structure 110 is formed on the substrate 101.

The light emitting structure 110 can be formed by sequentially depositing the second conductive semiconductor layer 116, the active layer 114, and the first conductive semiconductor layer 112 on the substrate 101. The second conductive semiconductor layer 116 is an n type semiconductor layer including n type dopant and the first conductive semiconductor layer 112 is a p type semiconductor layer including p type dopant, but the embodiment is not limited thereto.

Figure 11B:
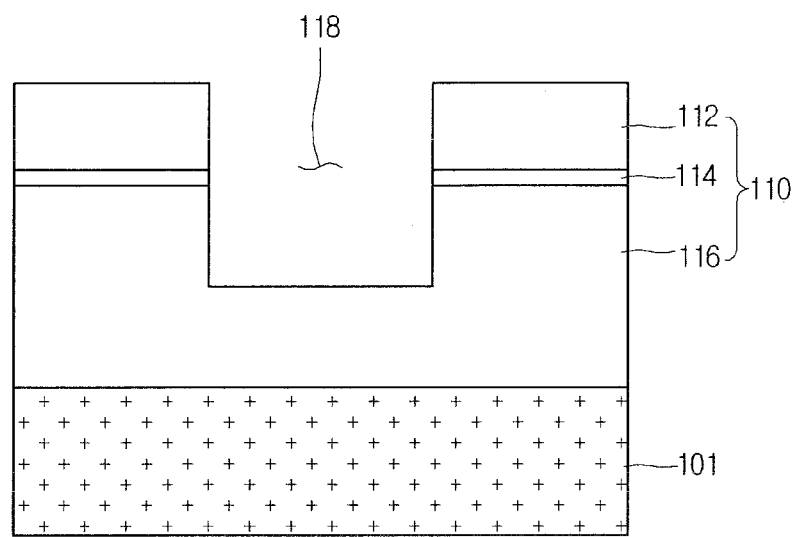

Referring to FIG. 11B, the center region of the light emitting structure 110 is selectively removed such that the top surface of the second conductive semiconductor layer 116 can be partially exposed, thereby forming the cavity 118.

Figure 11C:
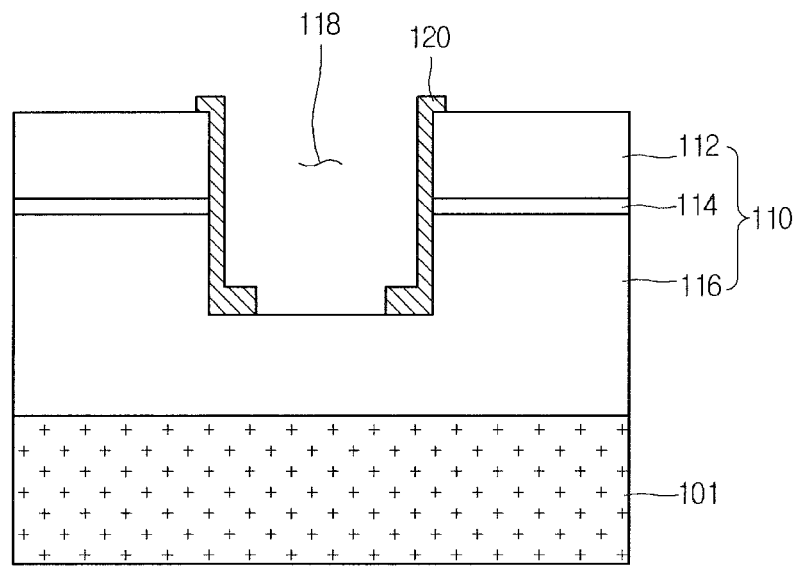

Referring to FIG. 11C, the first insulting layer 120 is formed at the inner wall of the cavity 118. In detail, the first insulting layer 120 extends from a part of the top surface of the second conductive semiconductor layer 116 to a part of a top surface of the first conductive semiconductor layer 112 by passing through the lateral sides of the second conductive semiconductor layer 116, the active layer 114 and the first conductive semiconductor layer 112.

Figure 11D:
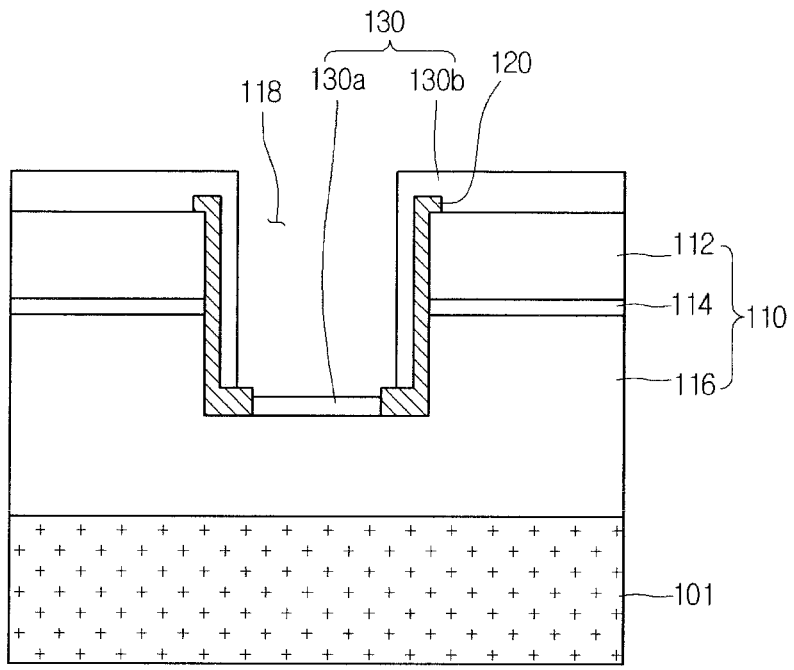

Referring to FIG. 11D, the first and second reflective layers 130a and 130b are formed simultaneously or independently.

The first reflective layer 130a can be formed on the top surface of the second conductive semiconductor layer 116 except for an area where the first insulating layer 120 is formed. In detail, the first reflective layer 130a is formed on the top surface of the second conductive semiconductor layer 116 exposed between the first insulating layers 120.

The first insulating layer 120 prevents the electric short from occurring among the first conductive semiconductor layer 112, the active layer 114 and the second conductive semiconductor layer 116 of the light emitting structure 110 caused by the second reflective layer 130b formed in the cavity 118.

Figure 11E:
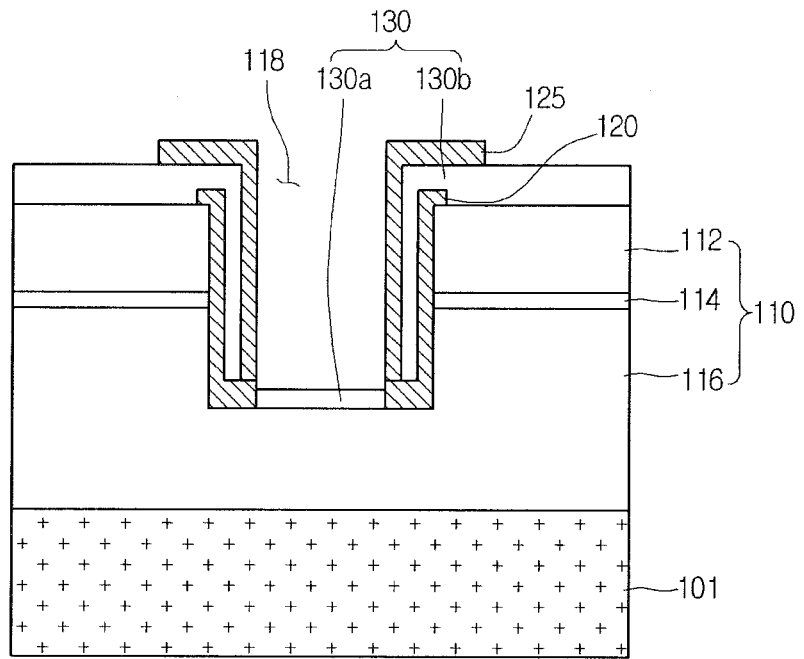

Referring to FIG. 11E, the second insulating layer 125 is formed in such a manner that the second insulating layer 125 is connected to the first insulating layer 120, which is formed on the top surface of the second conductive semiconductor layer 116, that is, the bottom surface of the cavity 118, while extending to a part of the second reflective layer 130b formed on the top surface of the first conductive semiconductor layer 112 in the cavity 118.

The second insulating layer 125 surrounds the entire surface of the second reflective layer 130b formed in the cavity 118. Thus, the second insulating layer can prevent the electric short between the first electrode 141 and the second reflective layer 130b.

The second insulating layer 125 may extend from the second insulating layer 125 formed in the cavity 118 to a part of the second reflective layer 130b formed on the top surface of the first conductive semiconductor layer 112. Thus, the second insulating layer 125 can prevent the electric short between the first and second electrodes 141 and 142.

Figure 11F:
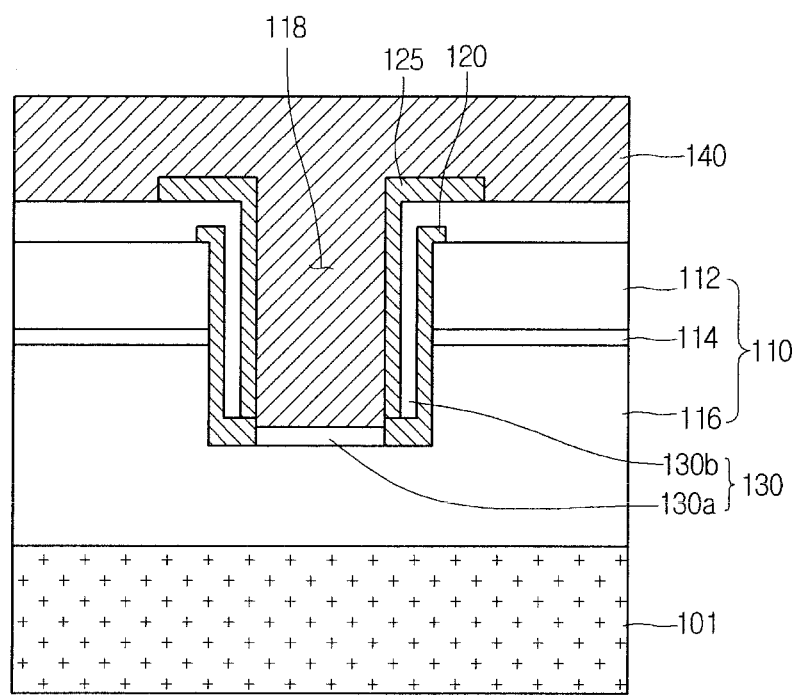

Referring to FIG. 11F, the metal layer 140 can be formed on the entire top surface of the light emitting structure 110 including the cavity 118 in such a manner that at least the cavity 118 can be filled with the metal layer 140. In detail, the metal layer 140 can be formed on the top surfaces of the second insulating layer 125 and the second reflective layer 130b while filling the cavity 118. In the cavity 118, the metal layer 140 makes contact with the top surface of the first reflective layer 130a formed on the bottom surface of the cavity 118 and the top surface of the second insulating layer 125 formed on the inner sidewall of the cavity 118.

Figure 11G:
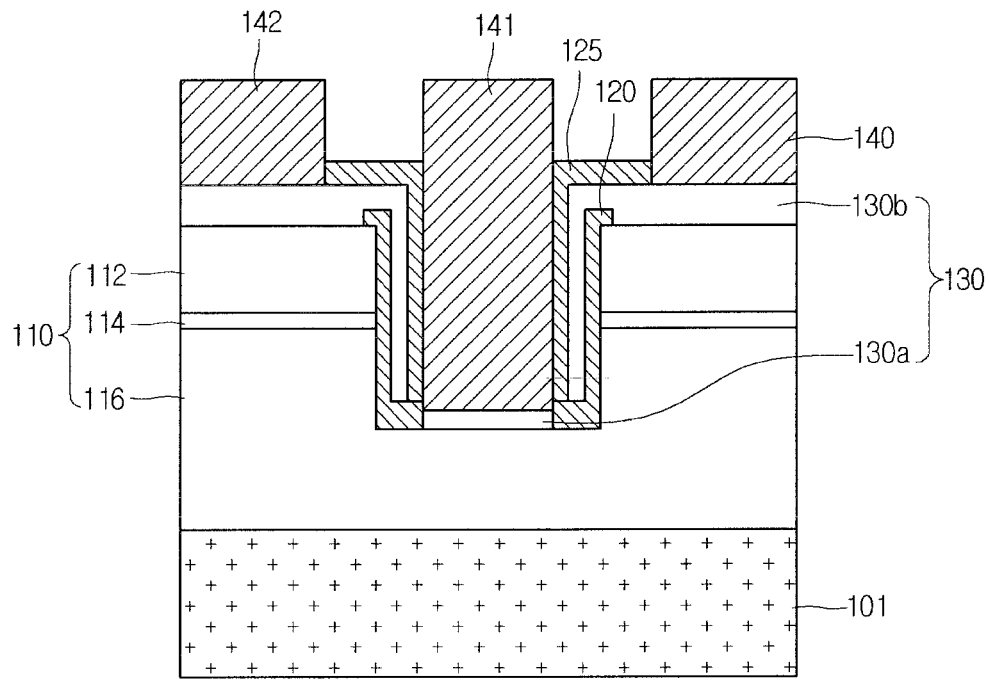

Referring to FIG. 11G, the metal layer 140 is selectively removed such that the top surface of the second insulating layer 125, which is formed on the top surface of the light emitting structure 110, can be exposed, thereby forming the first and second electrodes 141 and 142. A gap is formed between the first and second electrodes 141 and 142 to prevent the electric short from occurring between the first and second electrodes 141 and 142. The gap may have a size of about 10 µm to about 50 µm, but the embodiment is not limited thereto.

Figure 11H:
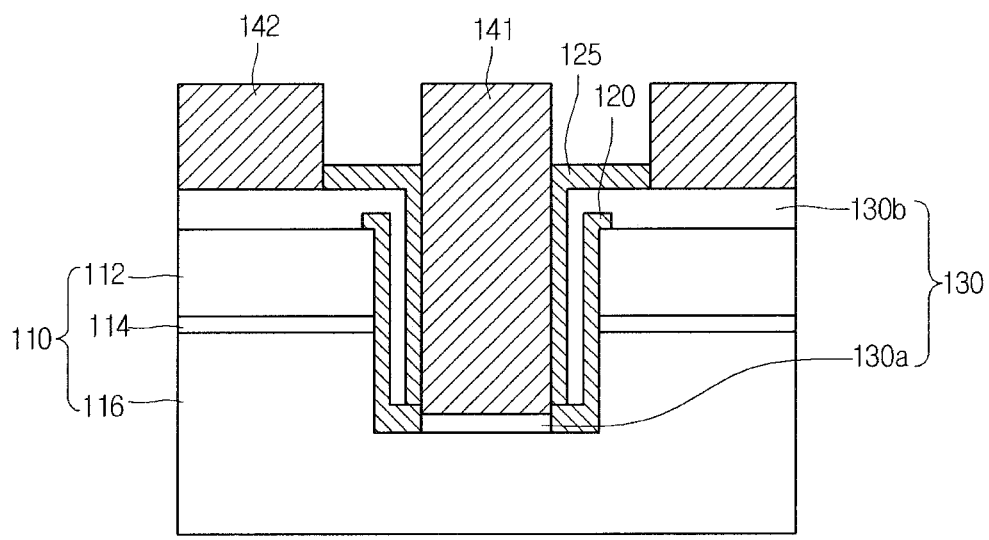

Referring to FIG. 11H, the substrate 101 can be removed through at least one of the LLO (laser lift off), CLO (chemical lift off) and physical polishing, but the embodiment is not limited thereto.

Figure 11I:
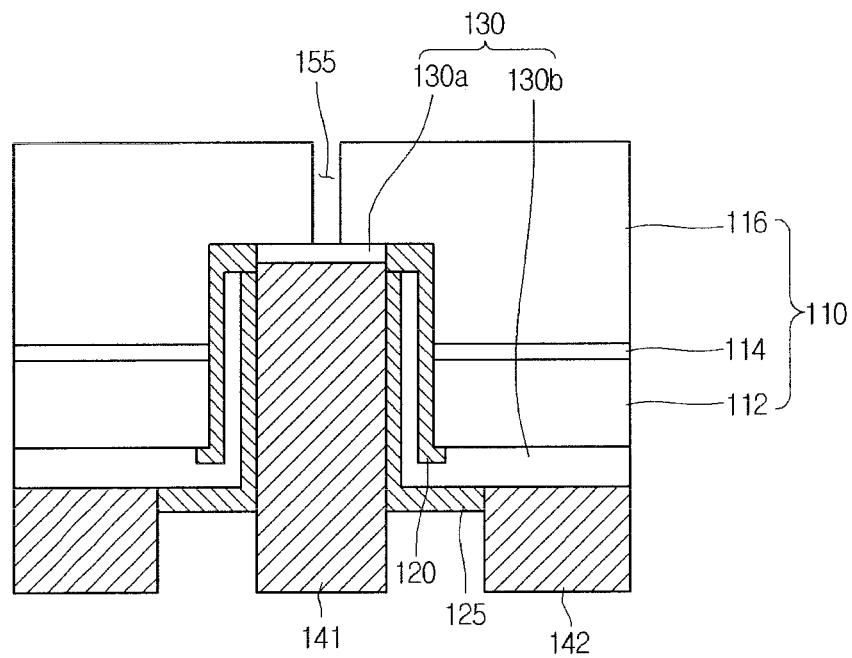

Referring to FIG. 11I, the second conductive semiconductor layer 116 is selectively removed to form the second cavity 155. The second cavity 155 is formed by passing through the second conductive semiconductor layer 116 such that the first reflective layer 130a is partially exposed through the second cavity 155.

For instance, the second cavity 155 can be formed using at least one of the etching process and the laser drilling process, but the embodiment is not limited thereto.

The inner wall of the second cavity 55 can be formed perpendicularly to the first reflective layer 130a through the etching process or the laser drilling process, but the embodiment is not limited thereto.

Figure 11J:
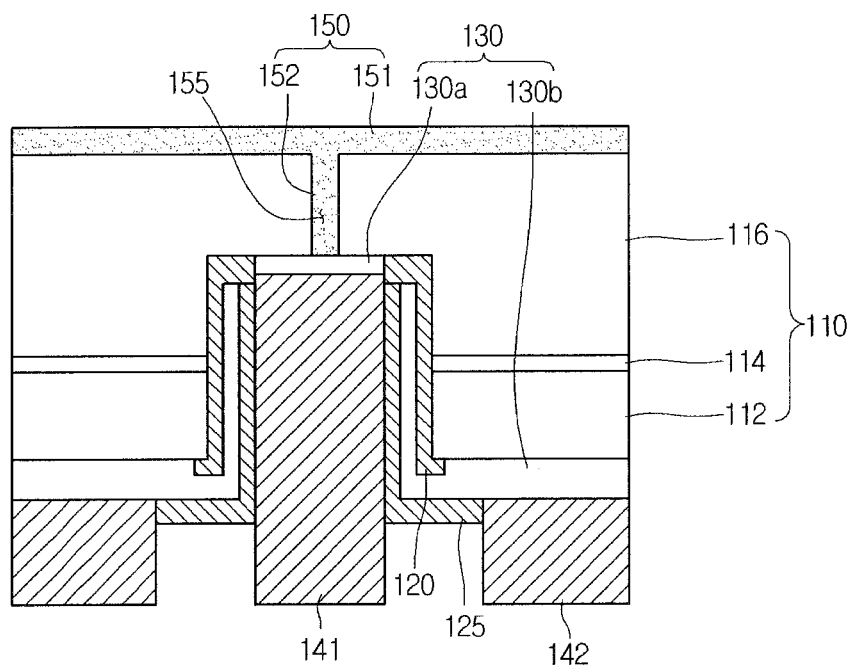

Referring to FIG. 11J, the conductive layer 150 is formed in the second cavity 155 and on the entire top surface of the second conductive semiconductor layer 116, thereby manufacturing the light emitting device 100D.

The conductive layer 150 may include the first conductive layer 151 formed on the top surface of the second conducive semiconductor layer 116 and the second conductive layer 152 extending from the first conductive layer 151 to the inside of the second cavity 155 to make contact with the first reflective layer 130a exposed in the second cavity 155.

Since the first reflective layer 130a has conductivity, the second conductive layer 152 can be electrically connected to the first electrode 141 through the first reflective layer 130a.

The first conductive layer 151 is formed on the top surface of the light emitting structure 110. In detail, the first conductive layer 151 is formed on the top surface of the second conductive semiconductor layer 116 at the thickness of about 100 nm to about 500 nm. The conductive member 150 including the first and second conductive layers 151 and 152 can be formed with a uniform thickness through the plating process or the deposition process, such as E-beam evaporation, sputtering, and PECVD.

The current supplied to the first electrode 141 can be spread over the whole area of the second conductive semiconductor layer 116 by the conductive member 150 including the first and second conductive layers 151 and 152, so that the light can be uniformly generated from the whole area of the active layer 114 of the light emitting structure 110. Thus, the light emitting efficiency of the light emitting device 100D can be improved.

In the manufacturing process for the light emitting device according to the fifth embodiment, the first and second electrodes 141 and 142 are formed prior to the conductive member 150. However, according to another embodiment, the conductive member 150 can be formed prior to the first and second electrodes 141 and 142, and the embodiment may not limit the sequence of the manufacturing process.

Figure 12:
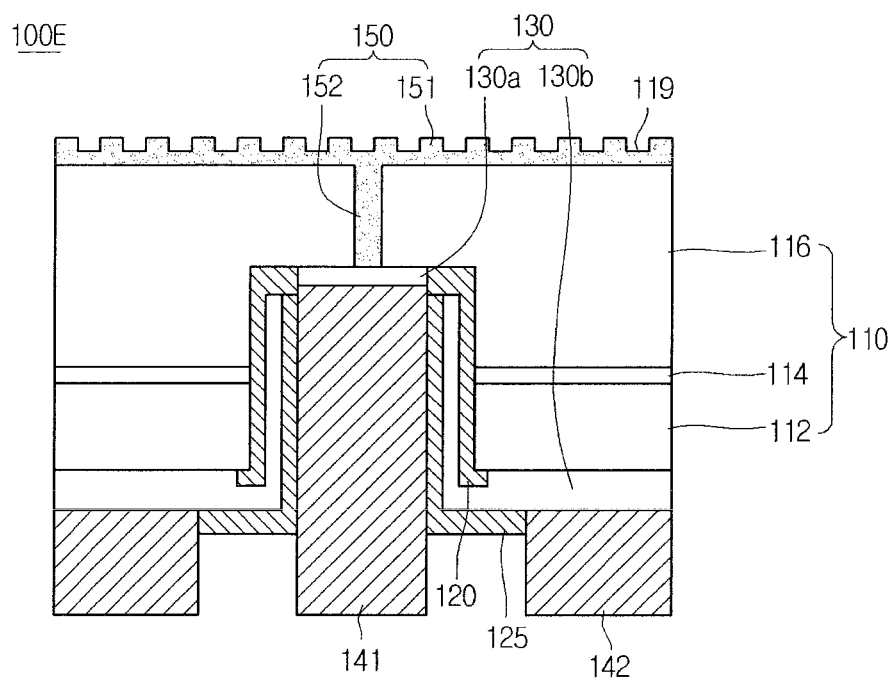
FIG. 12 is a side sectional view showing a light emitting device according to the sixth embodiment.

FIG. 12 is a side sectional view showing a light emitting device according to the sixth embodiment.

The light emitting device 100E according to the sixth embodiment is similar to the light emitting device 100 according to the first embodiment except that the roughness or the concavo-convex shape 119 is formed on the top surface of the light emitting structure. Thus, in the following description of the sixth embodiment, details of the elements and structures that have been described in the first embodiment will be omitted in order to avoid redundancy and the same reference numerals will be used to refer to the same elements.

Referring to FIG. 12, the light emitting device 100E according to the sixth embodiment includes the roughness or the concavo-convex structure 119 formed on the top surface of the conductive member 150, that is, on the entire top surface of the first conductive layer 151. The roughness or the concavo-convex structure 119 may not be formed on the top surface of the second conductive semiconductor layer 116.

For instance, the roughness or the concavo-convex structure 119 may include a photonic crystal structure having a period of 200 nm to 300 nm.

Due to the roughness or the concavo-convex structure 119 formed on the top surface of the first conductive layer 151, the light in the light emitting structure 110 can be emitted to the outside through the total reflection, so that the light extraction efficiency of the light emitting device 100E can be improved.

Figure 13:
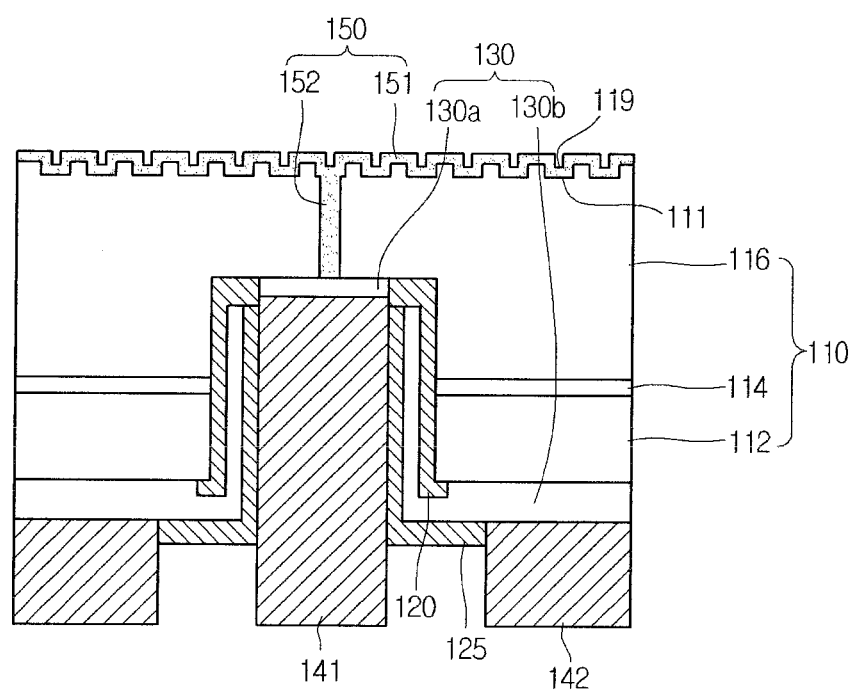
FIG. 13 is a side sectional view showing a light emitting device according to the seventh embodiment.

FIG. 13 is a sectional view of a light emitting device according to the seventh embodiment.

The light emitting device 100F according to the seventh embodiment is similar to the light emitting device 100B according to the third embodiment (FIG. 8) except that the conductive member 150 is formed on the top surface of the light emitting structure 110 or in the light emitting structure 110 and similar to the light emitting device 100D according to the fifth embodiment except that the first roughness or the first concavo-convex shape 111 is formed on the top surface of the second conductive semiconductor layer and the second concavo-convex shape 119 is formed on the top surface of the conductive member 150. Thus, in the following description of the seventh embodiment, details of the elements and structures that have been described in the third and fifth embodiments will be omitted in order to avoid redundancy and the same reference numerals will be used to refer to the same elements.

Referring to FIG. 13, the light emitting device 100F according to the seventh embodiment includes the first roughness or the first concavo-convex structure 111 formed on the entire top surface of the second conductive semiconductor layer 116, and the second roughness or the second concavo-convex shape 119 formed on the top surface of the conductive member 150, that is, formed on the entire top surface of the first conductive layer 151.

The first conductive layer 151 is formed on the second conductive semiconductor layer 116.

The second roughness or the second concavo-convex shape 119 can be formed on the top surface of the second conductive semiconductor layer 116 without performing an additional process due to the first roughness or the first second concavo-convex shape 119 formed on the second conductive semiconductor layer 116. The second roughness or the second concavo-convex shape 119 can be formed by performing a separate patterning process after forming the first conductive layer 151 on the second conductive semiconductor layer 116, and the embodiment is not limited thereto.

For instance, the second roughness or the second concavo-convex structure 119 may include a photonic crystal structure having a period of 200 nm to 300 nm.

Figure 14:
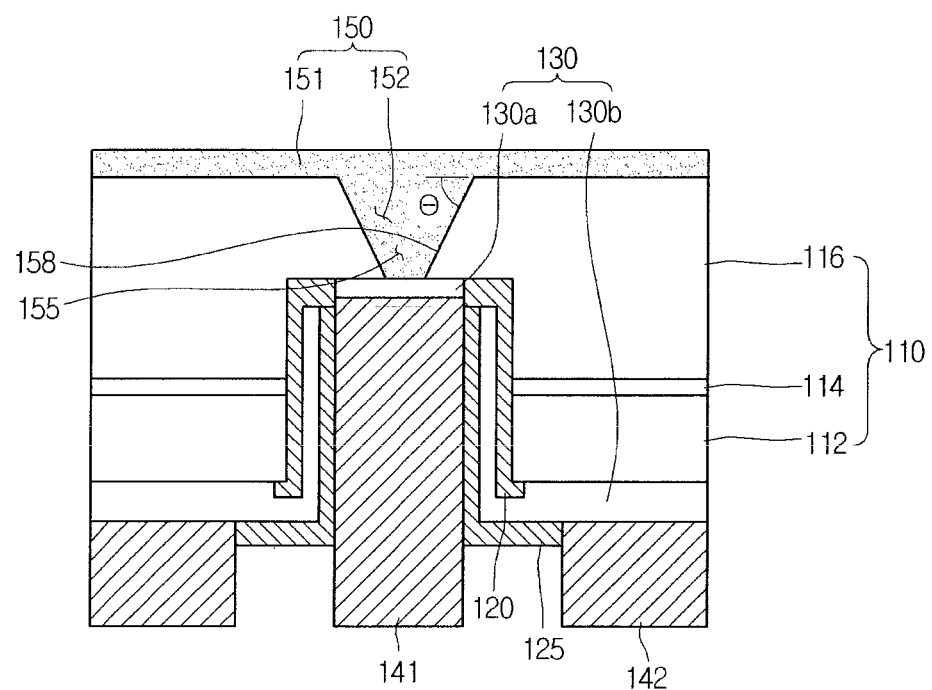
FIG. 14 is a side sectional view showing a light emitting device according to the eighth embodiment.

FIG. 14 is a side sectional view of a light emitting device according to the eighth embodiment.

The light emitting device 100G according to the eighth embodiment is similar to the light emitting device 100D according to the fifth embodiment except that the inner wall of the second cavity 155 is inclined with respect to the second conductive semiconductor layer 116. Thus, in the following description of the eighth embodiment, details of the elements and structures that have been described in the fifth embodiment will be omitted in order to avoid redundancy and the same reference numerals will be used to refer to the same elements.

Referring to FIG. 14, the light emitting device 100G according to the eighth embodiment includes the second cavity 155 formed by passing through the second conductive semiconductor layer 116 such that the first reflective layer 130a can be exposed through the second cavity 155. If the first reflective layer 130a is omitted, the first electrode 141 may be exposed.

The second cavity 155 may be inclined with respect to the top surface of the second conductive semiconductor layer 116. For instance, an inclined surface 158 of the second cavity 155 may have an inclination angle (θ) of about 30° to about 80° with respect to the top surface of the second conductive semiconductor layer 116. In other words, the inclination angle (θ) is defined between the inclined surface 158 and the top surface of the second conductive semiconductor layer 116.

The conductive member 150 is formed on the top surface of the second conductive semiconductor layer 116 and the inner sidewall of the second cavity 155.

The conductive member 150 includes the first conductive layer 151 formed on the top surface of the second conducive semiconductor layer 116 and the second conductive layer 152 extending from the first conductive layer 151 to the inside of the second cavity 155 to make contact with the first reflective layer 130a.

Thus, the lateral side of the second conductive layer 152 that makes contact with the inclined surface 158 of the second cavity 155 may also have an inclination angle (θ) of about 30° to about 80° with respect to the top surface of the second conductive semiconductor layer 116 to the top surface of the first conductive layer 151.

If the lateral side of the second conductive layer 152 is inclined, the distance between the second conductive layer 152 and the active layer 114 can be shortened. Thus, the current may easily flow and the quantity of the light emitted from the active layer 114 may be increased, so that the light emitting efficiency of the light emitting device 100G can be improved.

Figure 15:
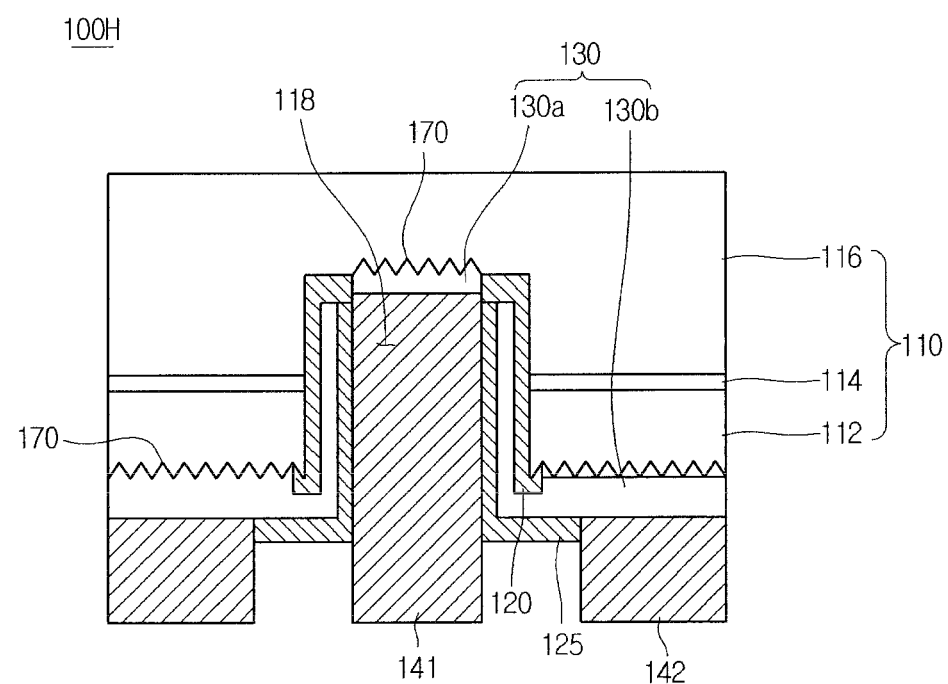
FIG. 15 is a side sectional view showing a light emitting device according to the ninth embodiment.

FIG. 15 is a sectional view of a light emitting device according to the ninth embodiment.

The light emitting device 100H according to the ninth embodiment is similar to the light emitting device 100 according to the first embodiment except that the roughness or the concavo-convex shape 170 is formed on the bottom surfaces of the first and second conductive semiconductor layers 112 and 116. Thus, in the following description of the ninth embodiment, details of the elements and structures that have been described in the first embodiment will be omitted in order to avoid redundancy and the same reference numerals will be used to refer to the same elements.

Referring to FIG. 15, the light emitting device 100B according to the ninth embodiment includes the roughness or the concavo-convex structure 170 formed on the bottom surfaces of the first and second conductive semiconductor layer 112 and 116.

In detail, the roughness or the concavo-convex structure 170 makes contact with the first and second reflective layers 130a and 130b. Thus, the light incident into the first reflective layer 130a from the second conductive semiconductor layer 116 and the second reflective layer 130b from the active layer 114 may be reflected in the front direction (or upward direction) or the lateral direction by the first and second reflective layers 130a and 130b. In this case, the light may be randomly spread in the front direction or the lateral direction, so that the light emitting efficiency of the light emitting device 100H can be more improved.

Figure 16:
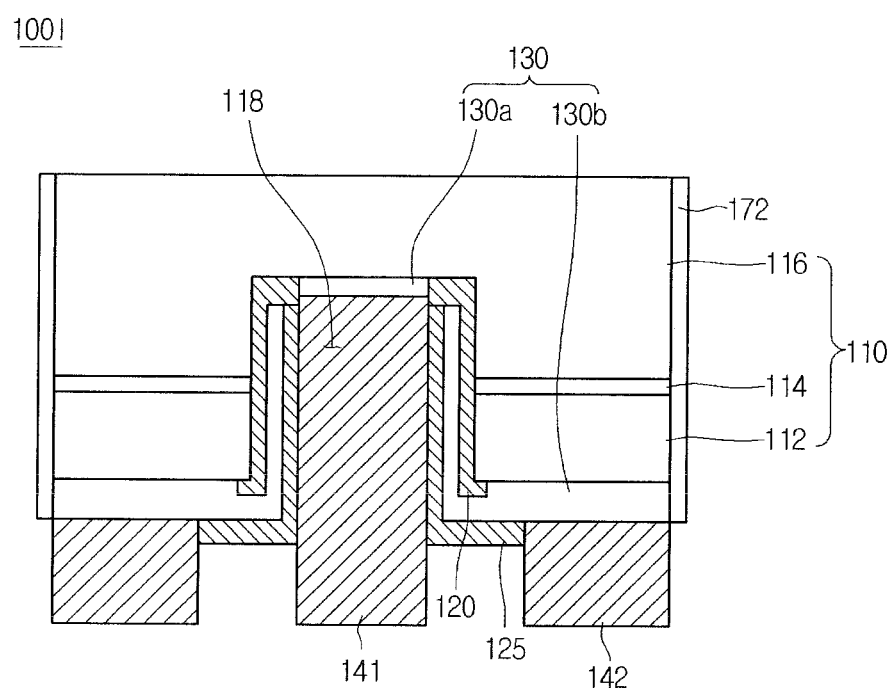
FIG. 16 is a side sectional view showing a light emitting device according to the tenth embodiment.

FIG. 16 is a sectional view of a light emitting device according to the tenth embodiment.

The light emitting device 100I according to the tenth embodiment is similar to the light emitting device 100 according to the first embodiment except that a passivation layer 172 is formed at the lateral side of the light emitting structure 110. Thus, in the following description of the tenth embodiment, details of the elements and structures that have been described in the first embodiments will be omitted in order to avoid redundancy and the same reference numerals will be used to refer to the same elements.

Referring to FIG. 16, the light emitting device 100I according to the tenth embodiment includes the passivation layer 172 formed at the lateral side of the light emitting structure 110.

The passivation layer 172 can be formed at the lateral sides of the first conductive semiconductor layer 112, the active layer 114 and the second conductive semiconductor layer 116 to protect the first conductive semiconductor layer 112, the active layer 114 and the second conductive semiconductor layer 116.

Due to the passivation layer 172, the light emitting structure 110 can be protected from external impurities, so that the electric short caused by the external impurities may not occur between the first conductive semiconductor layer 112 and the second conductive semiconductor layer 116.

The passivation layer 172 can be formed on the lateral side of the second reflective layer 130b as well as the lateral side of the light emitting structure 110.

The passivation layer 172 may include inorganic insulating materials, such as SiOx or SiNx, or organic insulating materials.

The passivation layer 172 may include a transparent insulating material. In this case, the light emitted from the active layer 114 may be guided in the lateral direction by passing through the passivation layer 172.

Figure 17:
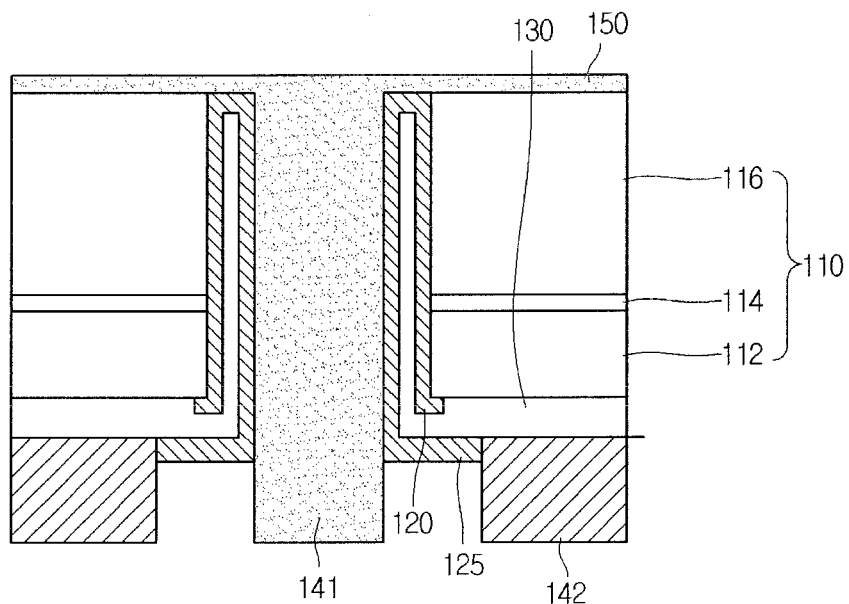
FIG. 17 is a side sectional view showing a light emitting device according to the eleventh embodiment.

FIG. 17 is a side sectional view of a light emitting device according to the eleventh embodiment.

The light emitting device 100J according to the eleventh embodiment is similar to the light emitting device 100D according to the fifth embodiment except that the first electrode 141 and the conductive member 150 are formed by using the same material. Thus, in the following description of the eleventh embodiment, details of the elements and structures that have been described in the fifth embodiments will be omitted in order to avoid redundancy and the same reference numerals will be used to refer to the same elements.

Referring to FIG. 17, the light emitting device 100J according to the eleventh embodiment includes the first electrode 141 extending through the light emitting structure 110 and the conductive member 150 extending from the first electrode 141 and formed on the light emitting structure 110.

The conductive member 150 is formed on the entire top surface of the light emitting structure 110, that is, on the entire top surface of the second conducive semiconductor layer 116.

A through path may be formed from the top surface to the bottom surface of the light emitting structure 110, that is, from the top surface of the second conductive semiconductor layer 116 to the bottom surface of the first conductive semiconductor layer 112.

The first electrode 141 extends from the conductive member 150 to the through hole formed between the top surface of the second conductive semiconductor layer 116 and the bottom surface of the first conductive semiconductor layer 112, and protrudes to have the height corresponding to the bottom surface of the second electrode 142.

The first electrode 141 makes contact with the second insulting layer 125 in the through path.

The first electrode 141 and the conductive member 150 are formed by using the same material.

The first electrode 141 and the conductive member 150 can be formed simultaneously or independently.

The first electrode 141 and the conductive member 150 may include materials having light transmittive and electric conductive properties. For instance, the first electrode 141 and the conductive member 150 may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, Ni, Ag and Au.

The first electrode 141 and the conductive member 150 may be provided with a single layer or a multiple layer by using at least one material having light transmittive and electric conductive properties.

Thus, the first electrode 141 has a function of an electrode for supplying the current.

The current supplied to the conductive member 150 from the first electrode 141 can be instantly spread over the whole area of the conductive member 150 having an area corresponding to the whole area of the second conductive semiconductor layer 116, so that the spreading current can be uniformly supplied from the conductive member 150 to the whole area of the second conductive semiconductor layer 116.

In addition, the conductive member 150 may have the light transmittive function to allow the light generated from the active layer 114 to be emitted to the outside through the conductive member 150.

Figure 18:
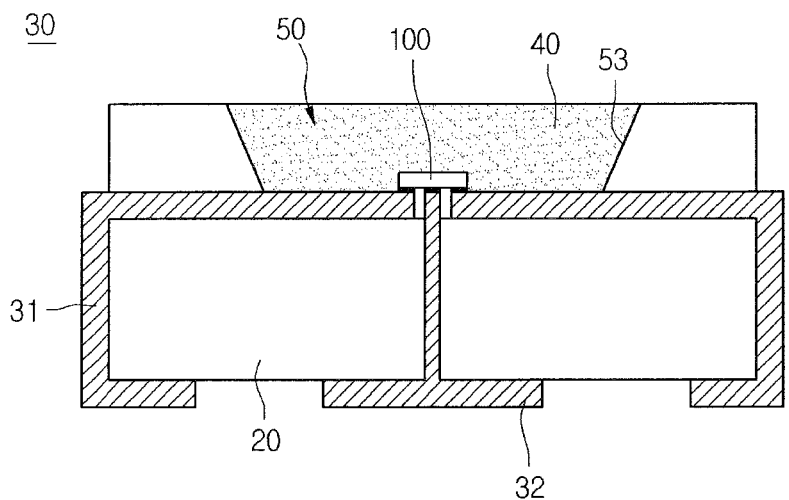
FIG. 18 is a sectional view showing a light emitting device package including a light emitting device according to the embodiment.

FIG. 18 is a sectional view showing a light emitting device package including the light emitting device according to the embodiments.

Referring to FIG. 18, the light emitting device package 30 according to the embodiment includes a package body 20, first and second lead electrodes 31 and 32 formed on at least a top surface and a lateral side of the package body 20, the light emitting device 100 provided on the package body 20 and electrically connected to the first and second lead electrodes 31 and 32 and a molding member 40 that surrounds the light emitting device 100.

The package body 20 may include silicon, synthetic resin or metallic material. When viewed from the top, the package body 20 has a cavity 50 formed with an inclined inner wall 53.

The first and second lead electrodes 31 and 32 are electrically isolated from each other and supply power to the light emitting device 100. The first and second lead electrode 31 and 32 may serve as a reflective plate to improve the light efficiency by reflecting the light emitted from the light emitting device 100. Further, the first and second lead electrodes 31 and 32 may serve as a heat dissipation plate to dissipate heat generated from the light emitting device 100 to the outside.

The second lead electrode 32 extends by passing through the package body 20. Although FIG. 18 shows the second lead electrode 32 extending by passing through the package body 20, the first lead electrode 31 may extend by passing through the package body 20 instead of the second lead electrode 32. This is changeable according to the electrode structure of the light emitting device 100, and the embodiment is not limited thereto.

The light emitting device 100 can be installed on the body 20 or one of the first and second lead electrodes 31 and 32.

The light emitting device 100 can be electrically connected to one of the first and second lead electrodes 31 and 32 through a wire scheme, a flip chip scheme or a die bonding scheme. For instance, the first electrode 141 of the light emitting device 100 is electrically connected to the second lead electrode 32, and the second electrode 142 of the light emitting device 100 is electrically connected to the first lead electrode 31.

The molding member 40 surrounds the light emitting device 100 to protect the light emitting device 100. In addition, the molding member 40 may include phosphors to change the wavelength of the light emitted from the light emitting device 100.

The light emitting device package may include at least one light emitting device according to the embodiments without limitations.

The light emitting device package may include a COB (chip on board) type light emitting device package, in which the package body 20 has a flat top surface and a plurality of light emitting devices 100 are installed on the package body 20.

Figure 19:
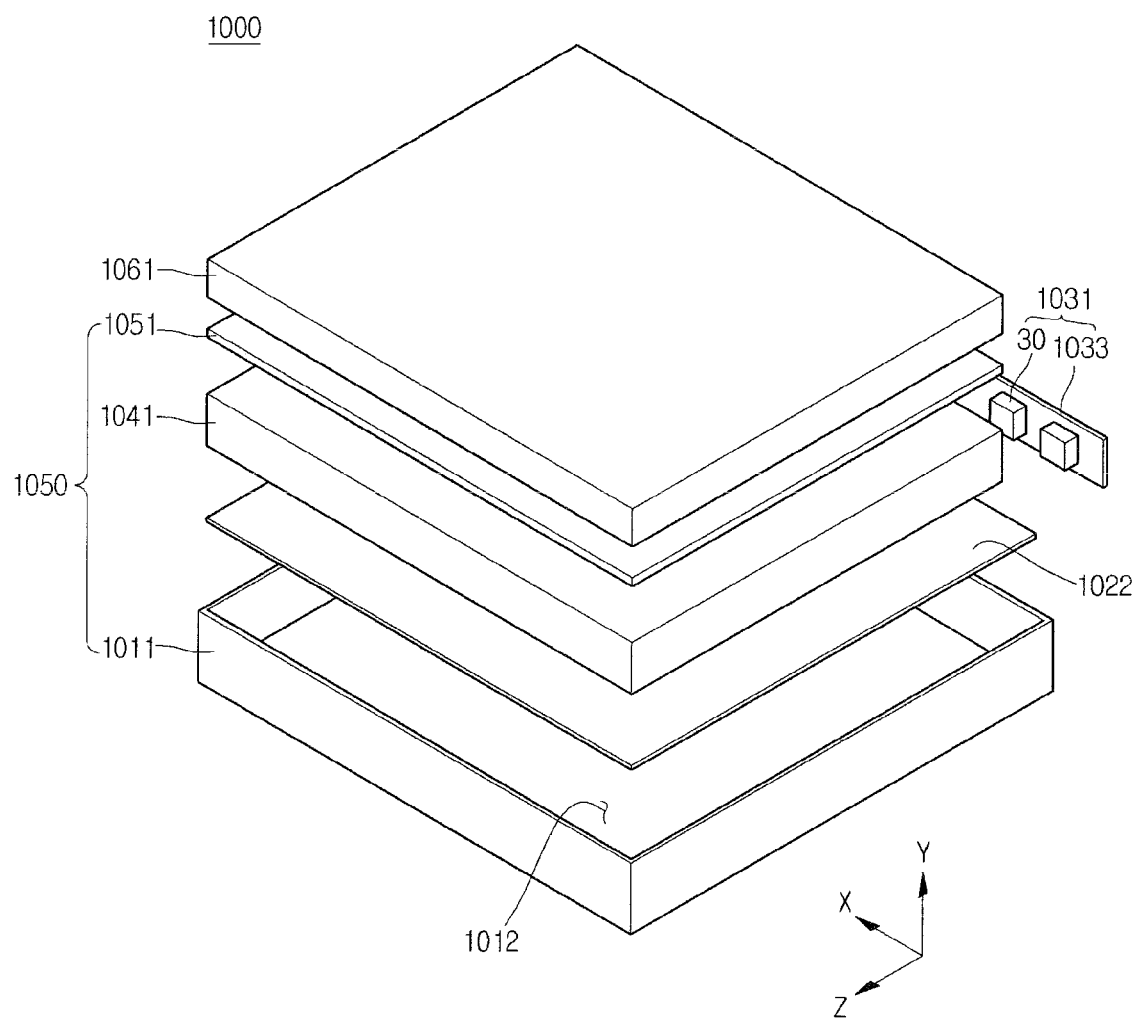
FIG. 19 is an exploded perspective view showing a display device according to the embodiment.
Figure 20:
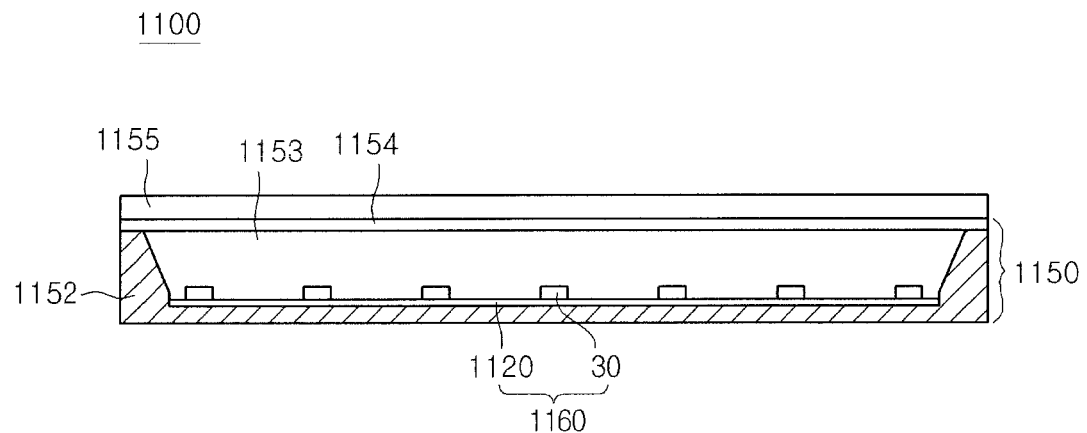
FIG. 20 is a sectional view showing a display device according to the embodiment.
Figure 21:
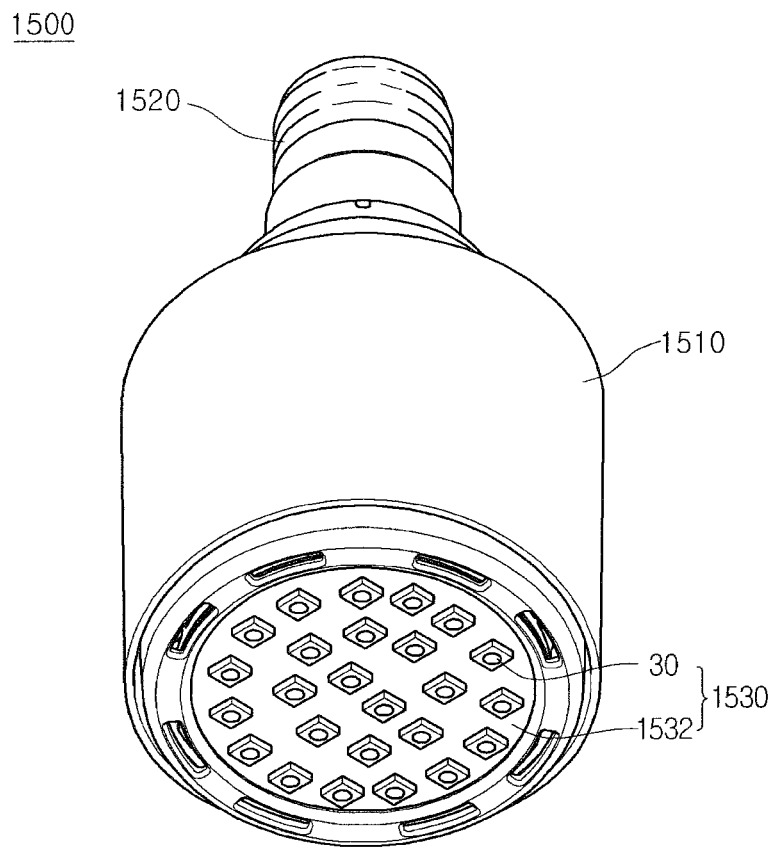
FIG. 21 is a perspective view showing a lighting device according to the embodiment.

The light emitting device or the light emitting device package according to the embodiment can be applied to the light unit. The light unit includes a structure in which a plurality of light emitting devices or a plurality of light emitting device packages are arrayed. The light unit may include the display device as shown in FIGS. 19 and 20 and the lighting device as shown in FIG. 21. In addition, the light unit may include a lighting lamp, a signal lamp, a headlight of a vehicle, and an electric signboard.

FIG. 19 is an exploded perspective view showing the display device according to the embodiment.

Referring to FIG. 19, the display device 1000 includes a light guide plate 1041, a light emitting module 1031 for supplying the light to the light guide plate 1041, a reflective member 1022 provided below the light guide plate 1041, an optical sheet 1051 provided above the light guide plate 1041, a display panel 1061 provided above the optical sheet 1051, and a bottom cover 1011 for receiving the light guide plate 1041, the light emitting module 1031, and the reflective member 1022. However, the embodiment is not limited to the above structure.

The bottom cover 1011, the reflective sheet 1022, the light guide plate 1041 and the optical sheet 1051 may constitute a light unit 1050.

The light guide plate 1041 diffuses the light supplied from the light emitting module 1031 to provide surface light. The light guide plate 1041 may include transparent material. For instance, the light guide plate 1041 may include one of acryl-based resin, such as PMMA (polymethyl methacrylate), PET (polyethylene terephthalate), PC (polycarbonate), COC (cyclic olefin copolymer) and PEN (polyethylene naphthalate) resin.

The light emitting module 1031 is disposed on at least one side of the light guide plate 1041 to supply the light to at least one side of the light guide plate 1041. The light emitting module 1031 serves as the light source of the display device.

At least one light emitting module 1031 is provided to directly or indirectly supply the light from one side of the light guide plate 1041. The light emitting module 1031 may include a substrate 1033 and light emitting device packages 30 according to the embodiments. The light emitting device packages 30 are arranged on the substrate 1033 while being spaced apart from each other at the predetermined interval. The substrate 1033 may include a printed circuit board (PCB), but the embodiment is not limited thereto. In addition, the substrate 1033 may also include a metal core PCB (MCPCB) or a flexible PCB (FPCB), but the embodiment is not limited thereto. If the light emitting device packages 30 are installed on the side of the bottom cover 1011 or on a heat dissipation plate, the substrate 1033 may be omitted. The heat dissipation plate partially makes contact with the top surface of the bottom cover 1011. Thus, the heat generated from the light emitting device packages 30 can be emitted to the bottom cover 1011 through the heat dissipation plate.

In addition, the light emitting device packages 30 are arranged such that light exit surfaces of the light emitting device packages 30 are spaced apart from the light guide plate 1041 by a predetermined distance, but the embodiment is not limited thereto. The light emitting device packages 30 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which is travelled downward through the bottom surface of the light guide plate 1041, toward the display panel 1061, thereby improving the brightness of the display panel 1061. For instance, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for instance, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by blocking the light generated from the light emitting module 1031 or allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmittive sheet. For instance, the optical sheet 1051 includes at least one of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be provided on the display panel 1061, but the embodiment is not limited thereto.

The light guide plate 1041 and the optical sheet 1051 can be provided in the light path of the light emitting module 1031 as optical members, but the embodiment is not limited thereto.

FIG. 20 is a sectional view showing a display device according to the embodiment.

Referring to FIG. 20, the display device 1100 includes a bottom cover 1152, a substrate 1120 on which the light emitting device packages 30 are arranged, an optical member 1154, and a display panel 1155.

The substrate 1120 and the light emitting device packages 30 may constitute the light emitting module 1060. In addition, the bottom cover 1152, at least one light emitting module 1060, and the optical member 1154 may constitute the light unit.

The bottom cover 1151 can be provided with a receiving section 1153, but the embodiment is not limited thereto.

The optical member 1154 may include at least one of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto the display panel 1155, and the brightness enhanced sheet improves the brightness by reusing the lost light.

The optical member 1154 is disposed above the light emitting module 1060 in order to convert the light emitted from the light emitting module 1060 into the surface light. In addition, the optical member 1154 may diffuse or collect the light.

FIG. 21 is a perspective view showing a lighting device according to the embodiment.

Referring to FIG. 21, the lighting device 1500 includes a case 1510, a light emitting module 1530 installed in the case 1510, and a connection terminal 1520 installed in the case 1510 to receive power from an external power source.

Preferably, the case 1510 includes material having superior heat dissipation property. For instance, the case 1510 includes metallic material or resin material.

The light emitting module 1530 may include a substrate 1532 and light emitting device packages 30 installed on the substrate 1532. The light emitting device packages 30 are spaced apart from each other or arranged in the form of a matrix.

The substrate 1532 includes an insulating member printed with a circuit pattern. For instance, the substrate 1532 includes a PCB, an MCPCB, an FPCB, a ceramic PCB, and an FR-4 substrate.

In addition, the substrate 1532 may include material that effectively reflects the light. A coating layer can be formed on the surface of the substrate 1532. At this time, the coating layer has a white color or a silver color to effectively reflect the light.

At least one light emitting device package 30 is installed on the substrate 1532. Each light emitting device package 30 may include at least one LED (light emitting diode) chip. The LED chip may include an LED that emits the light of visible ray band having red, green, blue or white color and a UV (ultraviolet) LED that emits UV light.

The light emitting device packages 30 of the light emitting module 1530 can be variously combined to provide various colors and brightness. For instance, the white LED, the red LED and the green LED can be combined to achieve the high color rendering index (CRI).

The connection terminal 1520 is electrically connected to the light emitting module 1530 to supply power to the light emitting module 1530. The connection terminal 1520 has a shape of a socket screw-coupled with the external power source, but the embodiment is not limited thereto. For instance, the connection terminal 1520 can be prepared in the form of a pin inserted into the external power source or connected to the external power source through a wire.

According to the embodiment, the first and second electrodes are disposed on the same plane so that the light emitting device can be easily packaged into the light emitting device package and the wire is not necessary during the packaging process, so that the process efficiency can be improved.

According to the embodiment, the first and second electrodes are formed on the bottom surface of the light emitting structure, so that the light loss caused by the electrodes formed at the top surface and lateral sides of the light emitting structure can be reduced.

According to the embodiment, the first and second electrodes are directly packaged to serve as the heat dissipation plate, so that the heat dissipation performance can be improved.

According to the embodiment, the reflective member is provided around the first and second electrodes formed on the bottom surface of the light emitting structure, so that the light can be reflected as much as possible, thereby improving the light extraction efficiency.

According to the embodiment, the capacitance is generated due to the insulating layer formed between the p type semiconductor layer and the first electrode, so that a least amount of current is applied to the light emitting structure upon the ESD, thereby preventing the light emitting structure from being damaged by the ESD.

According to the embodiment, the light emitting device includes a plurality of electrodes, so that the current can be sufficiently supplied even if the light emitting device has the large size.

According to the embodiment, the cavity to form the first electrode has the inclined inner wall and the reflective member formed in the cavity is also inclined, so that the light is reflected upward as much as possible, thereby improving the light extraction efficiency.

According to the embodiment, the insulating member is formed at the lateral sides of the first and second semiconductor layers and the active layer in the cavity, so that the electric short can be prevented from occurring between the first electrode and the first semiconductor layer and among the reflective layer, the first electrode and the second semiconductor layer.

According to the embodiment, the concavo-convex shape is formed on the top surface of the second semiconductor layer, so that the light in the light emitting structure can be emitted to the outside through the total reflection due to the concavo-convex shape, thereby improving the light extraction efficiency.

According to the embodiment, the conductive member connected to the first electrode is formed on over the whole area of the second conductive layer, so the current supplied to the first electrode can be spread over the whole area of the second conductive semiconductor layer. In addition, the current can be supplied to the second semiconductor layer from the whole area of the conductive member, so that the light can be uniformly generated from the whole area of the active layer, thereby achieving the uniform light emitting efficiency.

According to the embodiment, the conductive member formed on the second semiconductor layer has the light transmittive property, so that the light generated from the light emitting structure can be emitted to the outside without the light loss.

According to the embodiment, since the cavity formed in the second semiconductor layer has the inclined inner wall, the conductive member formed in the cavity is also inclined, so that the distance between the conductive member and the active layer can be shortened. Thus, the quantity of the light emitted from the active layer can be increased, so that the light emitting efficiency can be improved.

According to the embodiment, the concavo-convex shape is formed on the top surface of the conductive member, and the light in the light emitting structure can be emitted to the outside through the total reflection due to the concavo-convex shape, thereby improving the light extraction efficiency.

Meanwhile, the method of manufacturing the light emitting device according to the embodiment includes the steps of forming the light emitting structure including the first semiconductor layer, the active layer and the second semiconductor layer, forming the cavity by selectively removing the light emitting structure until the second semiconductor layer is exposed, forming the insulating layer on the top surface of the first semiconductor layer and on the inner wall of the cavity except for the outer peripheral region of the bottom surface of the first semiconductor layer, forming the metal layer in the cavity and on the entire bottom surface of the first semiconductor layer, and selectively removing the metal layer to form the first and second electrodes electrically connected to each other by the insulating layer.

The light emitting device package according to the embodiment includes a body, first and second lead electrodes on the body, and a light emitting device electrically connected to the first and second lead electrodes on the body, wherein the light emitting device includes the light emitting structure having the first semiconductor layer, the active layer, the second semiconductor layer, and the cavity formed by passing through the first semiconductor layer and the active layer to expose the second semiconductor layer, the first electrode extending out of the cavity from the second semiconductor layer formed in the cavity, the second electrode disposed on the outer peripheral region of the bottom surface of the first semiconductor layer and spaced apart from the lateral side of the first electrode while surrounding the lateral side of the first electrode, and the first insulating layer interposed between the lateral side of the first electrode and the light emitting structure.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a light emitting structure including a first semiconductor layer, an active layer and a second semiconductor layer;
   a first cavity passing through the first semiconductor layer and the active layer to expose the second semiconductor layer;
   a first electrode extending to the outside of the first cavity from the second semiconductor layer in the first cavity;
   a second electrode disposed on an outer peripheral region of a bottom surface of the first semiconductor layer and spaced apart from the first electrode while surrounding a lateral side of the first electrode;
   a first insulating layer between the first electrode and the light emitting structure;
   a first reflective layer between the first electrode and the second semiconductor layer;
   a second reflective layer between the first semiconductor layer and the second electrode, a part of the second reflective layer extending between the first electrode and the first insulating layer; and
   a second insulating layer between the first electrode and the second reflective layer,
   wherein a bottom surface of the first electrode is coplanar with a bottom surface of the second electrode.

2. The light emitting device of claim 1, wherein the first semiconductor layer is a p type semiconductor layer and the second semiconductor layer is an n type semiconductor layer.

3. The light emitting device of claim 1, wherein a bottom surface of the first electrode has the same height as that of a bottom surface of the second electrode.

4. The light emitting device of claim 1, wherein the first insulating layer is disposed on an inner wall of the first cavity to insulate the first electrode from the first semiconductor layer and the active layer.

5. The light emitting device of claim 1, wherein the second insulating layer is disposed on a bottom surface of the second reflective layer between the first and second electrodes.

6. The light emitting device of claim 1, wherein the second insulating layer is connected to the first insulating layer in the first cavity with second reflective layer therebetween.

7. The light emitting device of claim 1, wherein the first insulating layer includes a dielectric material to form capacitance.

8. The light emitting device of claim 1, wherein a top surface of the first insulating layer is substantially higher than a top surface of the first electrode.

9. The light emitting device of claim 1, wherein a top surface of the first insulating layer is substantially flush with a top surface of the first reflective layer.

10. The light emitting device of claim 1, wherein a lateral width of the first reflective layer is substantially same with a lateral width of the first electrode.

11. The light emitting device of claim 1, wherein a top surface of the second insulating layer is substantially flush with a top surface of the part of the second reflective layer.

12. The light emitting device of claim 1, wherein a lateral width of the second reflective layer is wider than a lateral width of the second electrode.

13. A light emitting device comprising:
a light emitting structure including a first semiconductor layer, an active layer and a second semiconductor layer;
a first cavity passing through the first semiconductor layer and the active layer to expose the second semiconductor layer;
a first electrode extending to the outside of the first cavity from the second semiconductor layer in the first cavity;
a second electrode disposed on an outer peripheral region of a bottom surface of the first semiconductor layer and spaced apart from the first electrode while surrounding a lateral side of the first electrode;
a first insulating layer between the first electrode and the light emitting structure;
a first reflective layer between the first electrode and the second semiconductor layer;
a second reflective layer between the first semiconductor layer and the second electrode, a portion of the second reflective layer extending between the first electrode and the first insulating layer; and
a second insulating layer between the first electrode and the second reflective layer,
wherein the second reflective layer comprises a lateral portion and a vertical portion that extends from the lateral portion.

14. The light emitting device of claim 13, wherein the vertical portion of the second reflective layer is provided through the active layer and the second semiconductor layer.

15. The light emitting device of claim 13, wherein a top portion of the vertical portion is disposed higher than a bottom portion of the second semiconductor layer.

16. The light emitting device of claim 13, wherein the second insulating layer is disposed on a bottom surface of the second reflective layer.

17. The light emitting device of claim 13, wherein the second insulating layer is connected to the first insulating layer.

18. The light emitting device of claim 13, wherein a top surface of the first insulating layer is substantially flush with a top surface of the first reflective layer.

19. The light emitting device of claim 13, wherein a top surface of the second insulating layer is substantially flush with a top surface of the part of the second reflective layer.

20. The light emitting device of claim 13, wherein a lateral width of the second reflective layer is wider than a lateral width of the second electrode.

* * * * *